United States Patent [19]

Shinya et al.

[11] Patent Number: 4,534,312

[45] Date of Patent: Aug. 13, 1985

[54] VACUUM EVAPORATION APPARATUS

[75] Inventors: Ryohei Shinya; Shin'ichi Miura, both of Tokyo; Rikio Aozuka, Kanagawa, all of Japan

[73] Assignee: Ricoh Company, Ltd., Japan

[21] Appl. No.: 527,662

[22] Filed: Aug. 30, 1983

[30] Foreign Application Priority Data

| Aug. 30, 1982 | [JP] | Japan | 57-129802[U] |
| Dec. 9, 1982 | [JP] | Japan | 57-216040 |
| Dec. 10, 1982 | [JP] | Japan | 57-216659 |
| Feb. 16, 1983 | [JP] | Japan | 58-24326 |
| Feb. 16, 1983 | [JP] | Japan | 58-24327 |
| Feb. 16, 1983 | [JP] | Japan | 58-20107[U] |
| Feb. 17, 1983 | [JP] | Japan | 58-23739 |
| Apr. 25, 1983 | [JP] | Japan | 58-72576 |
| May 20, 1983 | [JP] | Japan | 58-88957 |

[51] Int. Cl.$^3$ .............................. C23C 13/08
[52] U.S. Cl. ........................ 118/666; 118/718; 118/724; 118/725; 118/730; 118/60; 118/500; 165/61; 165/89; 165/90; 165/104.26
[58] Field of Search .............. 118/728, 725, 724, 730, 118/729, DIG. 11, 59, 60, 500, 718, 733, 666; 427/107, 251, 255.5, 124; 430/128; 165/104.21, 104.23, 104.24, 61, 66, 89, 164, 165, 104.19, 48, 65

[56] References Cited

U.S. PATENT DOCUMENTS

| 3,216,489 | 11/1965 | Norton | 165/14 |
| 3,818,982 | 6/1974 | Wagner | 118/724 |
| 4,360,058 | 11/1982 | Muellejans | 165/104.21 |

Primary Examiner—John D. Smith
Assistant Examiner—Bernard F. Plantz
Attorney, Agent, or Firm—Guy W. Shoup

[57] ABSTRACT

A vacuum evaporation apparatus for depositing an evaporant as a thin film on a substrate comprises a sealed container including a substrate support for mounting thereon the substrate. A heat medium such as of diphenyl, for example, is filled in the substrate support. The heat medium in the substrate support is supplied with heat by a heater. When heated, the heat medium is vaporized and the vapor gas having absorbed heat of evaporation is moved quickly from a high-temperature region to a low-temperature region. The vapor gas in the low-temperature region is supersaturated and turned into the heat medium liquid. The heat energy born as latent heat by the vapor gas is given off to heat the substrate support uniformly. With this thermosiphon action, the substrate can be heated through the substrate support so as to have a uniform overall temperature distribution for forming a uniformly deposited thin film on the substrate surface.

24 Claims, 43 Drawing Figures

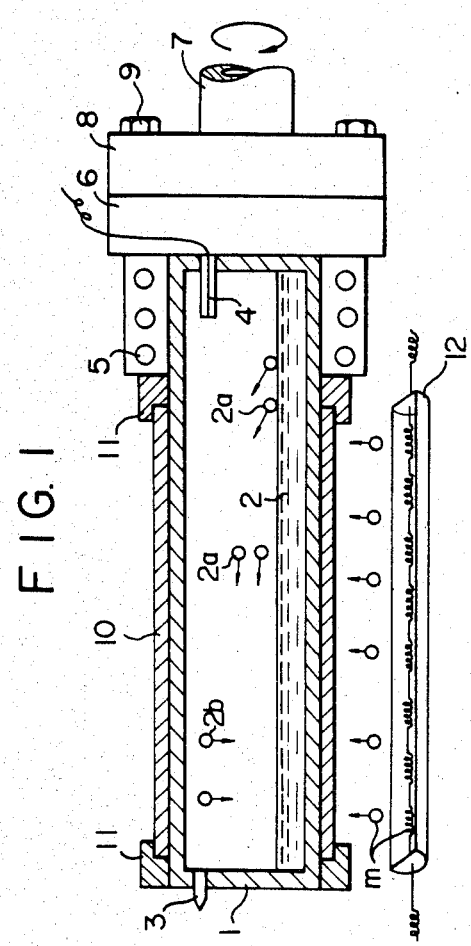
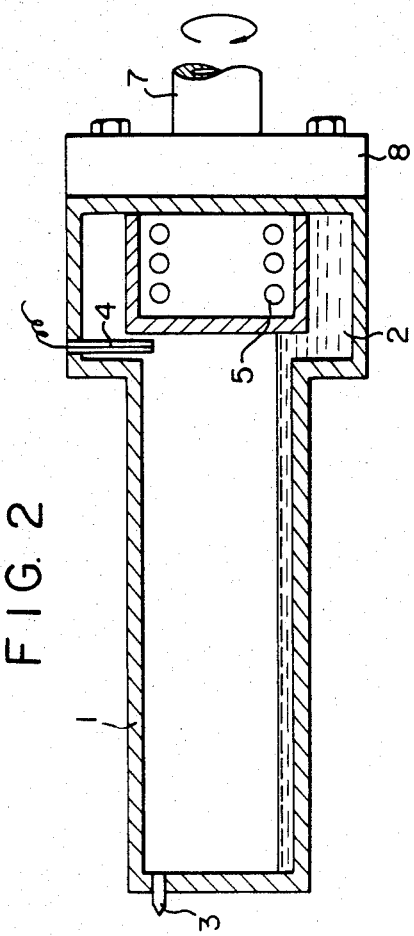
F I G. 1
F I G. 2

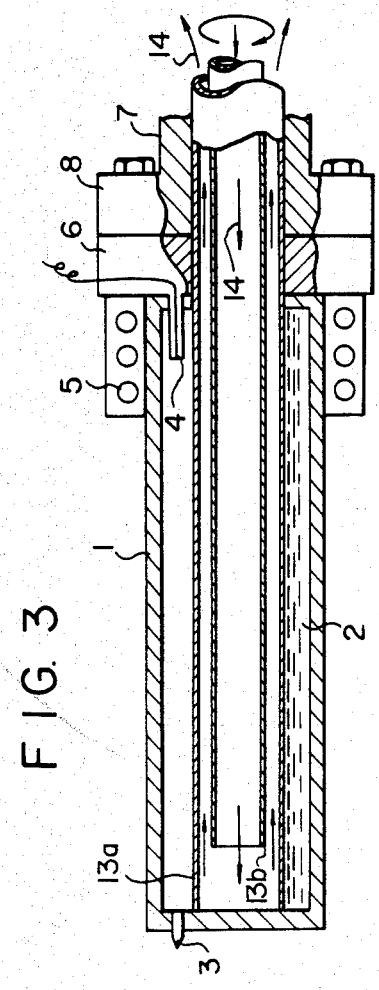
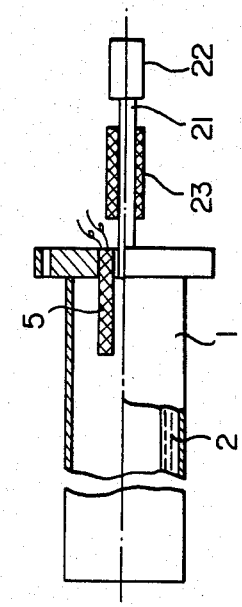
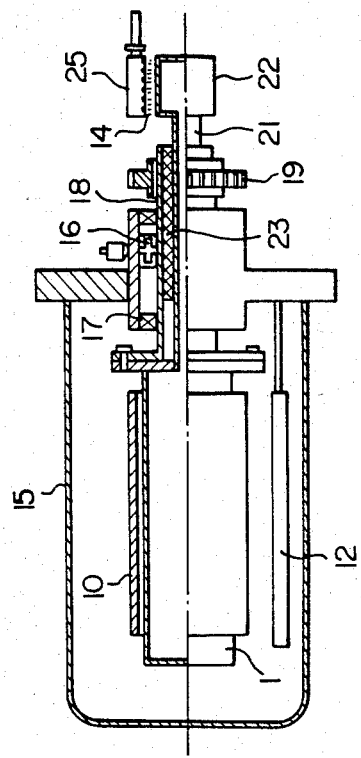
FIG. 3
FIG. 5
FIG. 4

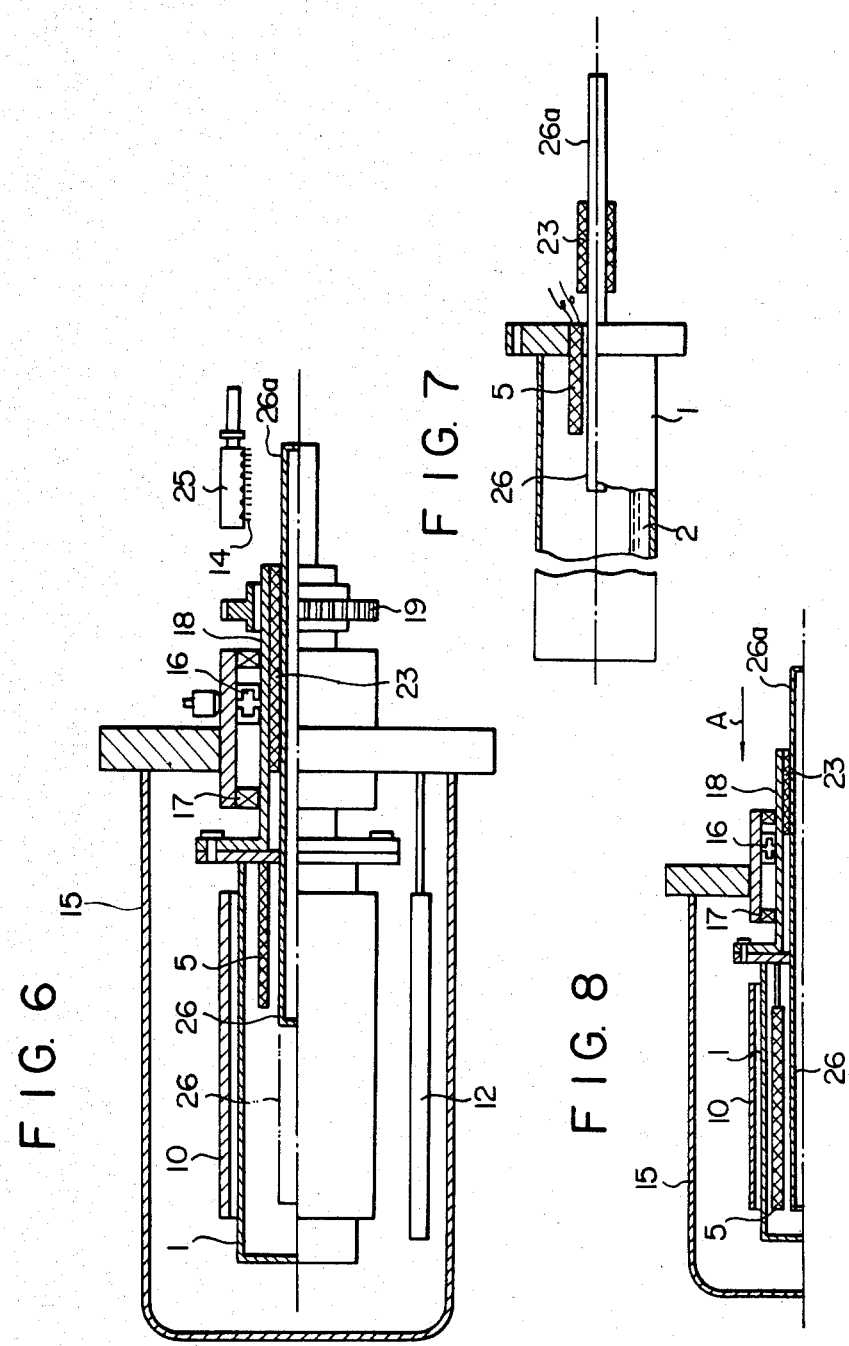

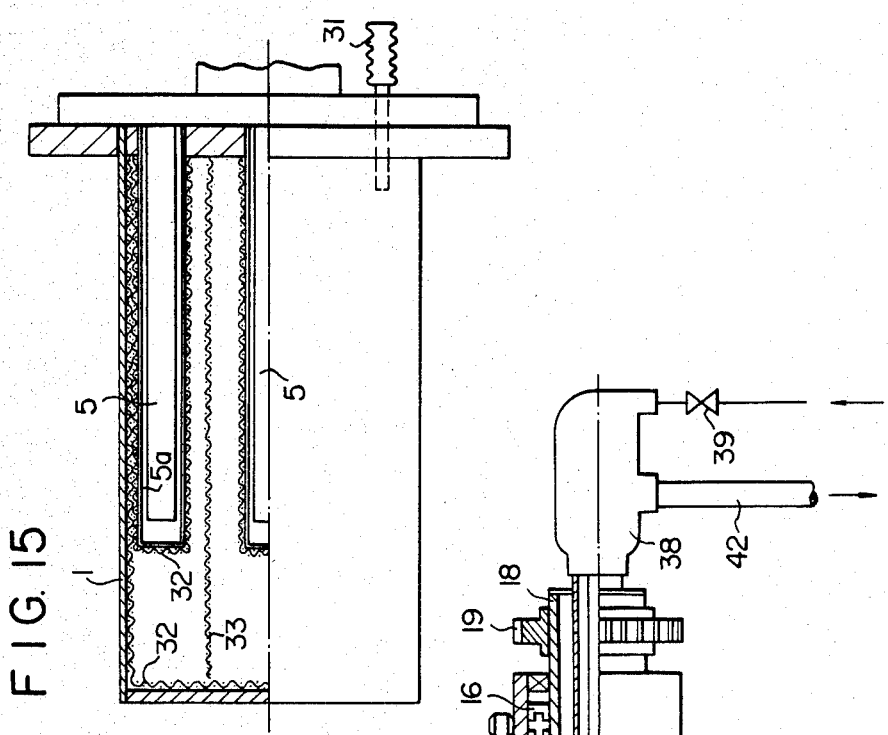
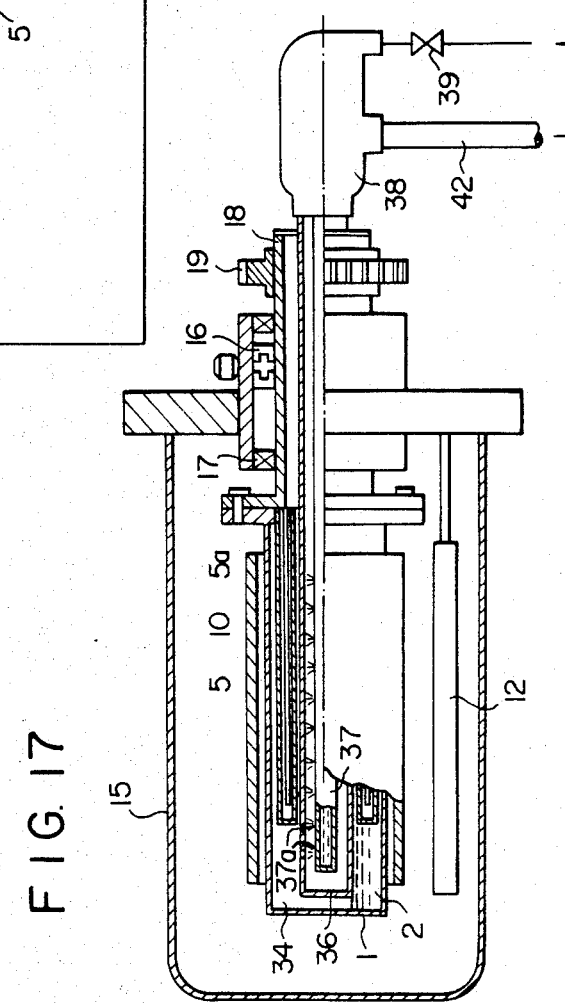

VACUUM EVAPORATION APPARATUS

BACKGROUND OF THE INVENTION

The present invention relates to a vacuum evaporation apparatus for depositing an evaporant as a thin film on a substrate.

There has been proposed a vacuum evaporation apparatus having a bell jar for defining a vacuum chamber, a storage tank for storing a heat medium such as oil heated to a desired temperature, a substrate support in the form of a container for supporting a substrate thereon, and a pump disposed outside of the bell jar for pumping the heated heat medium from the storage tank into the substrate support to heat the substrate therein and from the substrate support back into the storage tank to thereby effect forced circulation of the heat meadium.

The known vacuum evaporation apparatus with forced heat medium circulation requires the heat medium storage tank, the pump for forcibly circulating the heat medium, a piping for the circulation therethrough of the heat medium, and other parts necessary for heat medium circulation, the pump and the piping being heat resistant. Accordingly, the apparatus is costly to construct. Another problem is that since the heat medium is subjected to a heat loss while it is being forcibly circulated, the heat medium cannot heat the substrate uniformly.

SUMMARY OF THE INVENTION

A vacuum evaporation apparatus according to the present invention includes a substrate support in the form of a sealed container for mounting a substrate thereon, a heat medium such as of diphenyl or alkyl naphthalene filled in the substrate support, and heater means for supplying heat energy to the heat medium.

The heater means is disposed inside or outside of the substrate support for directly heating the heat medium in the substrate support or indirectly heating the heat medium through the substrate support. When heated, the heat medium is vaporized and the vapor gas with heat of vaporization is rapidly moved into an area of lower temperature. The vapor gas when in the area of lower temperature is supersaturated and condensed into the liquid. At this time, the substrate support is uniformly heated by thermal energy borne as latent heat by the vapor gas.

The vacuum evaporation apparatus also includes cooling means disposed inside or outside of the substrate support for cooling the substrate through the substrate support after a thin film has been deposited on the substrate. The cooling means quickly cools the substrate so that the latter can be removed from the substrate support in a short period of time.

Accordingly, the vacuum evaporation apparatus of the invention is characterized by utilization of latent heat radiated by the heat medium to heat the substrate support and allow the substrate to cool rapidly after the thin film has been deposited on the substrate.

The vacuum evaporation apparatus according to the present invention is capable of heating the substrate support more uniformly since the latter is heated by the latent heat, as compared to conventional vacuum evaporation apparatus in which a heat medium such as oil is forcibly circulated for heating the substrate support. The substrate on which a thin film is to be deposited can be heated at its surface with a uniform temperature distribution, for thereby enabling an evaporant to be coated on the substrate as a thin film having a uniform thickness. Since the substrate can quickly be cooled after the film has been deposited thereon, the substrate can be detached from the substrate support in a short period of time. The vacuum evaporation apparatus is less costly to construct as it does not require the heat medium storage tank, the high-temperature-resistant pump, and other related parts which have been necessitated by the conventional vacuum evaporation apparatus.

Accordingly, it is an object of the present invention to provide an efficient and practical vacuum evaporation apparatus capable of depositing a thin film of a uniform thickness on a substrate and allowing the substrate to be taken out of the apparatus in a short period of time after the film has been deposited, without involving an increased expenditure of cost.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 1 is a cross-sectional view of a vacuum evaporation apparatus according to an embodiment of the present invention;

FIG. 2 is a cross-sectional view of a vacuum evaporation apparatus according to another embodiment, in which a heater is disposed in a mandrel;

FIG. 3 is a cross-sectional view of a vacuum evaporation apparatus according to still another embodiment, having an internal cooling means;

FIG. 4 is a partly cross-sectional view of a vacuum evaporation apparatus according to still another embodiment, having an external cooling means;

FIG. 5 is a partly cross-sectional view of a mandrel and cooling cylinder in the vacuum evaporation apparatus shown in FIG. 4;

FIG. 6 is a partly cross-sectional view of a vacuum evaporation apparatus according to a still further embodiment, equipped with another external cooling means;

FIG. 7 is a partly cross-sectional view of a mandrel and cooling cylinder in the vacuum evaporation apparatus shown in FIG. 6;

FIG. 8 is a fragmentary cross-sectional view of a vacuum evaporation apparatus according to still another embodiment, in which a cooling container is slidable, the view showing the position during cooling operation;

FIG. 15 is a partly cross-sectional view of a vacuum evaporation apparatus according to still another embodiment in which meshes are mounted on an inner wall of a mandrel and outer peripheral surfaces of heater protection pipes;

FIG. 17 is a partly cross-sectional view of a vacuum evaporation apparatus according to a still further embodiment, having a means for forcibly circulating a coolant;

DESCRIPTION OF THE PREFERRED EMBODIMENTS

Figure 9:
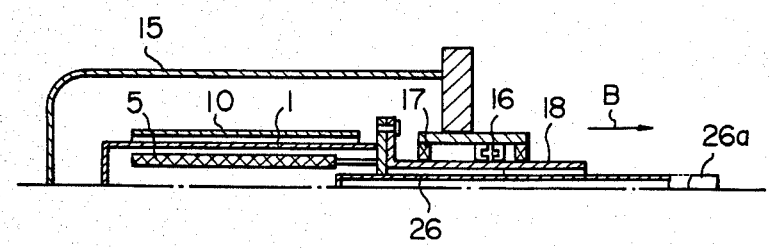
FIG. 9 is a fragmentary cross-sectional view of the vacuum evaporation apparatus illustrated in FIG. 8, the view showing the position during heating operation.

FIG. 1 shows a vacuum evaporation apparatus according to an embodiment of the present invention.

The vacuum evaporation apparatus comprises a mandrel 1 serving as a substrate support for mounting thereon a substrate on which a thin film is to be deposited. The mandrel 1 is in the form of a sealed container comprising a hollow cylindrical body with opposite ends closed. The mandrel 1 is filled therein with a heat medium 2 with any incondensable gas such as air, for example, discharged through a sealed hole 3 in advance. Therefore, the interior of the mandrel 1 is completely de-aired. The heat medium 2 may be of diphenyl or alkyl naphthalene, for example. The heat medium 2 of such a substance is thermally stable and has a high latent heat of vaporization. At a normal temperature or below, the heat medium is in the form of a liquid or a solid; however, when heated to a prescribed temperature under a certain pressure, the heat medium is boiled and vaporized. The temperature in the mandrel 1 is detected by a temperature sensor 4 disposed therein.

The mandrel 1 supports a heater 5 on one end thereof and is secured at the end to a disk-shaped flange 6 removably fastened to another disk-shaped flange 8 by means of bolts 9, the flange 8 being secured to a rotatable shaft 7. A tubular substrate 10 on which a thin film is to be deposited is fitted over the mandrel 1. The mandrel 1 is of such a diameter that when the tubular substrate 10 is mounted on the mandrel 1, the tubular substrate 10 is held in surface-to-surface contact with the mandrel 1 or spaced a gap from the mandrel 1. After the tubular substrate 10 has been disposed on the mandrel 1, the ends of the tubular substrate 10 are fixed to the mandrel 1 by rings 11 for rotation therewith in unison.

A heating crucible 12 serving as an evaporant source is disposed downwardly of the mandrel 1, that is, the tubular substrate 10 mounted on the mandrel 1, the heating crucible 12 containing an evaporant m. The evaporant m may be of selenium or a selenium alloy, for example. By depositing such an evaporant on the tubular substrate 10 which is electrically conductive, a phtoconductive drum with a selenium layer for use in electrophtography can be manufactured. The heating crucible 12, the mandrel 1 and the associated components are housed in a vacuum chamber defined by a bell jar (not shown).

Operation of the vacuum evaporation apparatus thus constructed will be described.

First, the tubular substrate 1 is mounted on the mandrel 1, and a certain desired vacuum is developed in the non-illustrated vacuum chamber. While detecting the temperature in the mandrel 1, the heat medium 2 in the mandrel 1 is heated by the heater 5 up to a prescribed temperature at a watt density such that the heat medium will not be thermally decomposed. The heat medium 2 thus heated is then vaporized into a gas 2a. The vapor gas 2a having acquired a heat of vaporization is moved quickly to an area in the mandrel 1 which has a low temperature. The vapor gas 2a moved to the low-temperature area becomes supersaturated and is condensed into a liquid 2b. The mandrel 1 is then heated by the heat energy borne as latent heat by the vapor gas 2a based on the principle of a so-called thermosiphon until the mandrel 1 is temperature-balanced. Thus, the mandrel 1 is heated so that its surface temperature becomes uniform. The tubular substrate 10 is heated by a heat transfer from the mandrel 1 that has been evenly heated, so that the outer peripheral surface of the tubular substrate 10, that is, the surface on which a film is to be deposited, will be uniformly heated with reduced temperature differences.

The tubular substrate 10 and the mandrel 1 are rotated by the rotatable shaft 10 under such a heated condition, and the crucible 12 is heated to vaporize the evaporant m, thereby depositing the latter as a thin film having a uniform coating thickness on the outer peripheral surface of the tubular substrate 10.

FIG. 2 illustrates a vacuum evaporation apparatus according to another embodiment. The vacuum evaporation apparatus shown in FIG. 2 differs from the vacuum evaporation apparatus of FIG. 1 in that a heater 5 is disposed in a mandrel 1 for directly heating a heat medium 2 contained in the mandrel 1. The heater 5 may comprise a heating element such as a Nichrome (trademark) wire mounted in a tube of stainless steel.

The vacuum evaporation apparatus of the present invention therefore employs a heat medium filled in a mandrel. By selecting various heat mediums, the tubular substrate can be heated to different temperatures ranging from a high temperature (300° C., for example) to a low temperature (100° C. or below, for example) dependent on the type of the evaporant used.

After the deposit has been formed on the tubular substrate 10, the latter is cooled so that is can be detached from the mandrel 1. The substrate 10 can be cooled by an arrangement, for example, shown in FIG. 3.

Pipes 13a, 13b are disposed as a double-walled construction in a mandrel 1, and a coolant 14 such as of water, air or the like is circulated through the pipes 13a, 13b, the pipes 13a, 13b and the coolant jointly constituting a cooling means. The mandrel 1 is first cooled by the cooling means, and then the tubular substrate 10 having been heated to an evaporation temperature is cooled in a vacuum down to a prescribed temperature after the vacuum evaporation process has been completed.

According to a conventional vacuum evaporation apparatus, a heat medium such as oil heated to a certain temperature in a storage tank is pumped into the mandrel 1 by a pump disposed outside of a bell jar defining the vacuum chamber and then pumped from the mandrel 1 back to the storage tank for forced circulation of the heat medium. With this prior arrangment, however, not only the storage tank is required, but also the high-temperature-resistant pump is needed where the mandrel is to be heated to a high temperature, with the result that the cost is increased. Since the mandrel is not sufficiently heated to a uniform temperature due to a heat loss in the circulation path, the surface temperature of the substrate cannot be made uniform.

With the present invention, however, the mandrel is heated uniformly by utilizing latent heat radiated by the heat medium for thereby allowing the substrate surface to be heated with a uniform temperature distribution and hence enabling the substrate to be deposited with a film having a uniform coating thickness. The arrangement of the invention does not necessitate any pump for forcibly circulating the heat medium, any heat medium circulation path, any storage tank, and other parts associated therewith, and can be constructed inexpensively. Another advantage is that the substrate can be heated up to a desired temperature within a reduced period of time since only the heat medium in the mandrel is to be heated.

The tubular substrate may be subjected to various modifications as to its outside and inside diameters and its thickness. The tubular substrate may also be made of various materials dependent on the type of a layer to be deposited thereon.

FIG. 4 shows another cooling system for cooling the mandrel 1. A bell jar 15 for developing a vacuum therein houses a mandrel 1, a tubular substrate 10, a heating crucible 12, and other related components. As illustrated in FIG. 5, the mandrel 1 is filled therein a heat medium 2 and a heater 5 is mounted in the mandrel 1.

As shown in FIG. 4, the mandrel 1 is fixed to an end of a rotatable tubular shaft 18 rotatably supported in a bearing 17 having a seal 16 therein and extending hermetically coaxially into the bell jar 15. The mandrel 1 is rotatably driven through the rotatable shaft 18 and a drive gear 19 attached to the other end of the rotatable shaft 18. A conduit 21 has one end joined to the mandrel 1 and coaxially through the rotatable shaft 18 and an opposite end projecting out of the rotatable shaft 18 and joined to a closed cooling cylinder 22. The cooling cylinder 22, the mandrel 1, and the conduit 21 jointly constitute an integral sealed container.

As illustrated in FIGS. 4 and 5, a thermal insulator 23 is wound around the conduit 21 within the rotatable shaft 18. In FIG. 4, a nozzle 25 is positioned adjacent to and radially outwardly of the cooling cylinder 22 for ejecting a coolant 14 such as water or air for cooling the cooling cylinder 22.

The drive gear 19 is driven by another gear (not shown) to rotate the rotatable shaft 18, the conduit 21, the mandrel 1, and the tubular substrate 10 in unison. During the rotation of these components, an evaporant is vaporized from the heating crucible 12 and deposited evenly on the peripheral surface of the tubular substrate 10. For the reason described above, the tubular substrate 10 on which the film has been deposited is required to be cooled down to a prescribed temperature in the vacuum. To this end, cold water or air is ejected from the nozzle 25 to cool the outer surface of the cooling cylinder 22. The heat medium 2 kept at a high temperature and having a high latent heat within the cooling cylinder 22 is quickly cooled and converted from a gaseous phase into a liquid phase. At this time, there is developed a pressure difference between the liquid phase and the remaining gaseous phase, thereby causing the high-temperature gas to be progressively moved from the mandrel 1 into the cooling cylinder 22 based on the principle of a thermosiphon. This allows the mandrel 1 to be cooled bodily from its interior.

The madrel 1 and the tubular substrate 20 mounted thereon are therefore cooled rapidly and uniformly. Since the mandrel 1, the cooling cylinder 22, and the conduit 21 are integrally joined as the sealed container which is cooled on its outer perpheral surface, there is no danger of leakage of the heat medium and of entry of the coolant into the bell jar 15. Therefore, the cooling system is highly safe during operation.

FIG. 6 is illustrative of another cooling means for cooling a substrate after a film has been deposited thereon. According to this embodiment, a heat medium having a boiling point different from that of a heat medium for heating a mandrel is sealed in a sealed cooling container. As shown in FIG. 6, a cooling container 26 in the form of a sealed hollow cylinder extends coaxially through a tubular rotatable shaft 18 and has a lefthand end (as shown) disposed coaxially in the mandrel 1 in a central position as shown by the solid line or in an end position as shown by the two-dot-and-dash line. The cooling container 26 has a righthand end projecting axially out of the rotatable shaft 18 and serving as a cooling end portion 26a.

The cooling container 26 has therein a sealed space completely independent of the sealed interior space in the mandrel 1. A heat medium (not shown) having a boiling point lower than that of a heat medium sealed in the mandrel 1 is sealed in the sealed space in the cooling container 26.

As shown in FIGS. 6 and 7, a thermal insulator 23 is wound and interposed between the cooling container 26 and the rotatable shaft 18. Adjacent to and radially outwardly of the cooling end portion 26a of the cooling container 26, there is disposed a nozzle 25 capable of selectively ejecting a plurality of coolants 14 having different boiling points for effectively cooling the cooling container 26.

More specifically, where the liquid used as a coolant 14 has a boiling point al and the temperature of the cooling container 26 is higher than or at least equal to the boiling point al, the cooling container 26 can effectively be cooled due to evaporation of the cooling medium. However, when the heat exchange progresses to the extent where the cooling container 26 is cooled down to a temperature lower than the boiling point al, it is more effective to eject a liquid having a boiling point bl lower than the boiling point al through the nozzle 25.

According to the embodiment of FIGS. 6 and 7, water is employed as the coolant 14 when the cooling container 26 is heated at 100° C. or a higher temperature, alcohol is used as the coolant 14 when either the cooling container 26 or the mandrel 1 is at a temperature below 100° C., and Freon (trademark) is employed as the coolant 14 when the cooling container 26 or the mandrel 1 is at a temperature of 30° C. through 40° C. or below.

The nozzle 25 may be arranged to eject the plurality of coolants 14 independently through a single nozzle orifice, or to eject the coolants 14 through respective nozzle orifices.

The drive gear 19 is driven by another gear (not shown) to rotate the rotatable shaft 18, the cooling container 26, the mandrel 1, and associated parts in unison. During the rotation of these components, an evaporant is vaporized from the heating crucible 12 and deposited evenly on the peripheral surface of the tubular substrate 10.

In order to cool the tubular substrate 10 after the deposition of the film thereon, the cooling medium 14 such as water is ejected from the nozzle 25 to cool the outer surface of the cooling end portion 26a. The heat medium kept at a high temperature and having a high latent heat within the cooling end portion 26a is quickly cooled and converted from a gaseous phase into a liquid phase. At this time, there is developed a pressure difference between the liquid phase and the remaining gaseous phase, thereby causing the high-temperature gas to be progressively moved from the mandrel 1 into the cooling end portion 26a due to a heat transfer. This allows the cooling container 26 to be cooled bodily from its interior.

When the cooling container 26 is cooled, the heat medium 2 held at a high temperature and having a high latent heat within the mandrel 1 is quickly cooled in a region closer to the cooling container 26 and converted from a gaseous phase into a liquid phase. At this time, there is developed a pressure difference between the liquid phase and the remaining gaseous phase, thereby forcing the gas remote from the cooling container 26 to be progressively moved into the cooling container 26 due to a heat transfer. The mandrel 1 is now cooled bodily from its interior.

Because the mandrel 1 and the tubular substrate 10 mounted thereon are cooled by the heat medium 2 in the mandrel 1 and the heat medium (not shown) in the cooling container 26, the tubular substrate 10 at a high temperature can be cooled with a uniform temperature distribution. Furthermore, the tubular substrate 10 can be heated and cooled repeatedly at desired times. The cooling efficiency is quite high as the heat medium in the cooling container 26 has a boiling point lower than that of the heat medium 2 in the mandrel 1. This cooling system is quite safe in operation since the cooling container 26 is cooled on its outer surface.

For quickly cooling the tubular substrate 10, the cooling container 26 may be of a larger diameter or of a reduced thickness to reduce its heat storage capacity as desired.

FIGS. 8 and 9 show a vacuum evaporation apparatus according to still another embodiment of the present invention. A mandrel 1 and a cooling container 26 are hermetically sealed, and the cooling container 26 is axially slidable to adjust the extent of projection therof into the mandrel 1.

A heat medium having a boiling point lower than that of a heat medium in the mandrel 1 is sealed in the cooling container 26. The mandrel 1 and the cooling container 26 are hermetically sealed, and the cooling container 26 is axially slidable in the mandrel 1. When a heater 5 is deenergized, that is, the mandrel 1 is cooled, the cooling container 26 is slid in the direction of the arrow A a greater distance into the mandrel 1, as shown in FIG. 8. When the heater 5 is energized, that is, the mandrel 1 is heated, the cooling container 26 is slidably moved in the direction of the arrow B to reduce the projection thereof into the mandrel 1.

With this arrangement, the cooling efficiency is increased, and the heat medium in the cooling container 26 is prevented from being heated to a higher temperature than desired and hence from being degraded. More specifically, the heat medium in the cooling container 26, having a lower boiling point than that of the heat medium 2 in the mandrel 1, is effective in providing stable operation even though a heat medium of the same boiling point as that of the heat medium 2 would sufficiently be effective. If the cooling container 26 were inserted as far as the distal end of the mandrel 1 as shown in FIG. 8, both the cooling container 26 and the mandrel 1 would be subjected to a temperature rise during heating operation, and the heat medium of the lower boiling point in the cooling container 26 would be heated to a higher temperature than required. To avoid this undesired condition, the cooling container 26 is pulled substantially out of the mandrel 1 as shown in FIG. 9 with the consequence that the heat medium in the cooling container 26 is effectively prevented from being heated to a higher temperature than required and thus from being deteriorated.

In cooling operation, any heat exchange through surfaces depends on surface areas available for such heat exchange. For better heat exchange, the cooling container 26 is inserted to the distal end of the mandrel 1 as illustrated in FIG. 8, a condition which results in increased surface areas for the promotion of effective cooling.

Figure 10:
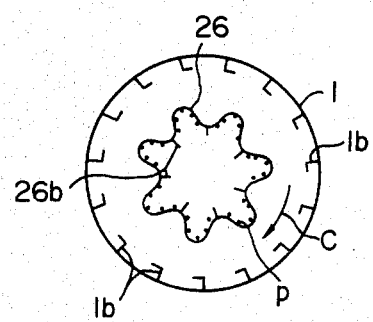
FIG. 10 is a schematic cross-sectional view of a mandrel having a plurality of scoop-up vanes mounted on an inner wall thereof according to still another embodiment.
Figure 11:
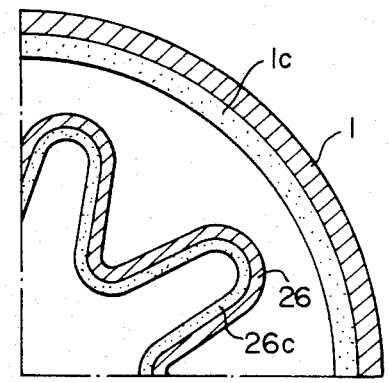
FIG. 11 is a fragmentary cross-sectional view of a mandrel with a porous layer mounted on its inner wall in accordance with still another embodiment.

According to still further embodiments shown in FIGS. 10 and 11, an inner wall construction of a mandrel 1 and a construction of a cooling container 26 are improved to improve the heating and cooling capabilities, particularly the cooling capability.

As illustrated in FIGS. 10 and 11, the cooling container 26 has an outer profile in the shape of a gear having lobe-shaped teeth. The cooling container 26 and the mandrel 1 shown in FIG. 10 have scoop-up vanes 26b, 1b respectively on their inner walls. The cooling container 26 and the mandrel 1 shown in FIG. 11 have porous layers 26c, 1c made of porous powdery metal material on their inner walls, respectively.

The cooling container 26 having the gear-shaped cross section provides an increased surface area available for heat exchange for an improved cooling capability. In addition, the cooling container 26 thus shaped effectively prevents inner wall portions (indicated by dots p in FIG. 10) of the cooling container 26 from being dried and assures uniform cooling. The scoop-up vanes 26b or the porous layer 26c on the inner wall of the cooling container 26 further assist in preventing the inner wall thereof from being dried for more uniform cooling.

The scoop-up vanes 1b or the porous layer 1c on the inner wall of the mandrel 1 is effective in preventing the inner wall thereof from being dried for more uniform heating and cooling abilities.

Figure 12:
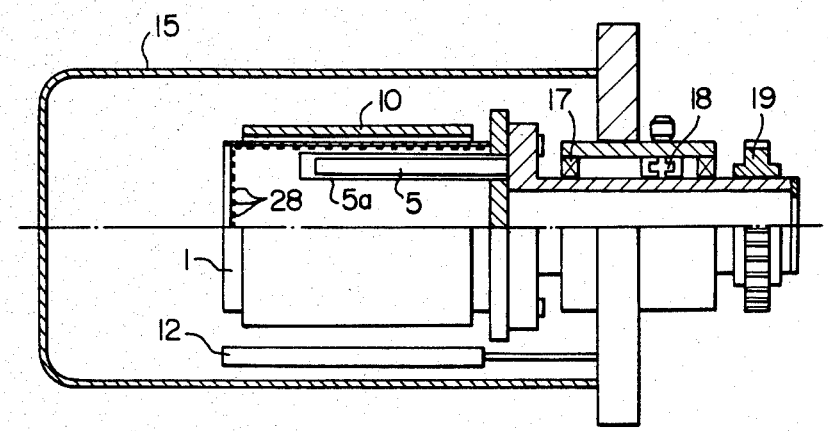
FIG. 12 is a partly cross-sectional view of a vacuum evaporation apparatus according to another embodiment in which a mandrel has a pattern of projections on its inner surface.
Figure 13:
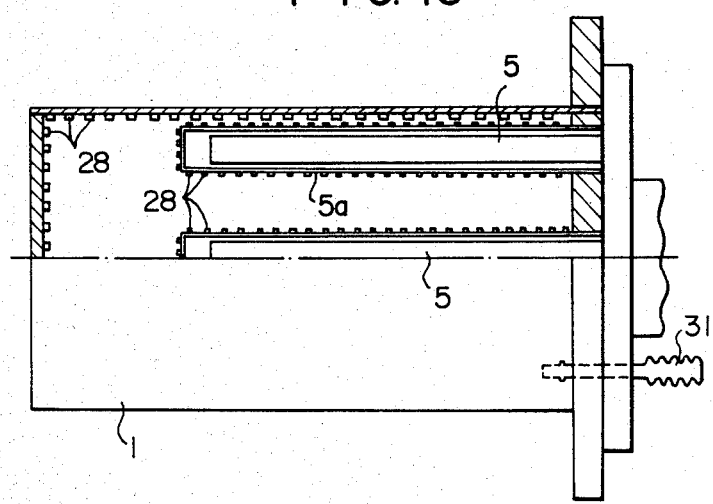
FIG. 13 is a partly cross-sectional view of a vacuum evaporation apparatus according to another embodiment in which patterns of projections are disposed on an inner wall of a mandrel and outer peripheral surfaces of heater protection pipes.
Figure 14:
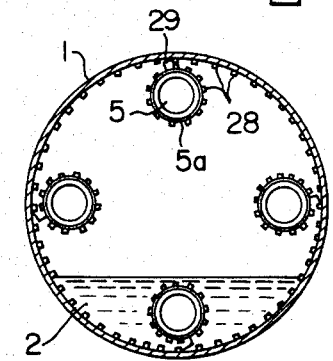
FIG. 14 is a cross-sectional view of the mandrel and heaters in the vacuum evaporation apparatus of FIG. 13.

FIGS. 12 through 14 are illustrative of another embodiment constructed for effectively preventing the inner wall of a mandrel 1 from being dried and for keeping the inner wall thereof wet at all times. With this embodiment, not only the inner wall of the mandrel 1 but also the outer surface of heaters are kept wet.

With mandrels of the type utilizing a heat transfer by a heat medium, the heat medium can be vaporized at a steady state for uniform heating when the outer surfaces of the heaters and the inner surface of the mandrel are kept wet with the sealed heat medium in the form of a liquid.

When the inner surface of the mandrel is partly dried, the dried portion tends to be locally subjected to an abnormal temperature rise due to heat radiation from the heaters. The localized high-temperature portion is then liable to suffer from a thermal distortion or other difficulties which will be a source of failure of the vacuum evaporation apparatus. The outer surface of the mandrel then has localized temperature spots. Where the substrate with a deposited film is employed as a photoconductive body in electrophotography, such localized temperature spots on the outer surface of the mandrel cause the photosensitive body to undergo localized sensitivity spots, localized darkdecay spots, or localized fatigue characteristic spots, and also cause any images duplicated by the photosensitive body to exhibit localized half-tone density spots and localized smeared spots on the background at the time of continuous copying operation.

Where a temperature sensor is disposed in the mandrel for increased reliability of the overall system for producing an output signal to control the supply of heat energy by the heaters, the overall system would malfunction or could run out of control if the temperature sensor were dried.

The foregoing difficulties can be eliminated by keeping wet the inner surface of the mandrel and the inner surfaces of the heaters.

According to the embodiment shown in FIGS. 12 through 14, the inner surface of the mandrel 1 and outer surfaces of heater protection pipes 5a covering the heaters 5 are roughened by providing patterns of projections 28, and each heater projection pipe 5a has an L-shaped scoop-up vane 29. When the mandrel 1 is rotated, a heat medium 2 is scooped and stirred by the scoop-up vanes 29 while the recesses between the projections 28 are kept wet to maintain the inner surface of the mandrel 1 and the outer surfaces of the heater protection pipes 5a wet at all times.

The projections 28 may comprise axial ridges on the inner surface of the mandrel 1 or the outer surfaces of the heater protection pipes 5a, or may be in the pattern of an inclined mesh shape. The inner surface of the mandrel 1 or the outer surfaces of the heater protection pipes 5a may otherwise be roughened by honing or shot blasting.

With this embodiment, the inner surface of the mandrel 1 and the outer surfaces of the heater protection pipes 5a have patterns of projections 28, and each heater protection pipe 5a has a scoop-up vane 29, so that the inner surface of the mandrel 1 can be kept wet with the heat medium 2 at all times. This enables uniform heating of the mandrel 1 and provides a uniform temperature distribution particularly in the longitudinal direction of the mandrel 1. The projections 28 and the scoop-up vanes are further effective in preventing the heat medium 2 from being degraded and thermally decomposed, and also preventing the mandrel 1 from being deteriorated.

The tubular substrate 10 is also uniformly heated. Where the tubular substrate 10 is employed as a photosensitive body for use in electrophotographic copying, it is effectively prevented from suffering localized sensitivity spots, localized charging spots, localized dark-decay spots, or localized fatigue characteristic spots, and any images duplicated by the photosensitive body are prevented from exhibiting localized half-tone density spots and localized smeared spots on the background at the time of continuous copying operation.

Where a temperature sensor disposed in the mandrel is used for controlling the temperature of the heaters 5, the temperature sensor is prevented from being dried, and any malfunction or uncontrolled operation of the overall system can be avoided.

Designated in FIG. 13 at 31 is a bellows-shaped pressure relief container joined to the mandrel 1 and capable of expanding when the interior of the mandrel 1 is subjected to an abnormal pressure buildup, thus relieving the mandrel 1 from the undesired high pressure.

Figure 16:
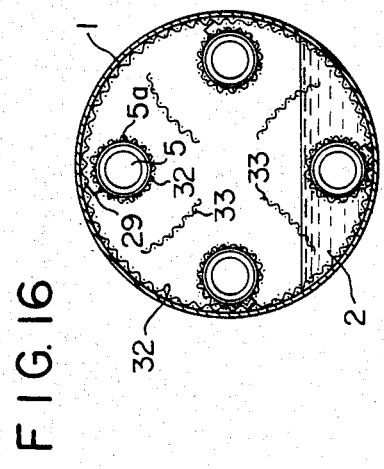
FIG. 16 is a cross-sectional view of the mandrel and heaters in the vacuum evaporation apparatus of FIG. 15.

FIGS. 15 and 16 show a still further embodiment in which meshes 32 are disposed on an inner surface of a mandrel 1 and outer surfaces of heater protection pipes 5a, and axial mesh vanes 33 are located between circumferentially adjacent heater protection pipes 5a.

The meshes 32 on the inner surface of the mandrel 1 and the outer surfaces of the heater protection pipes 5a serve to trap the heat medium 2 to keep the surfaces of the mandrel 1 and the heater protection surfaces 5a wet with the heat medium 2 at all times. The mesh vanes 33 are effective in wetting the interior of the mandrel 1. The meshes 32 shown in FIG. 15 may be replaced with porous layers made of porous powdery metal material.

Figure 18:
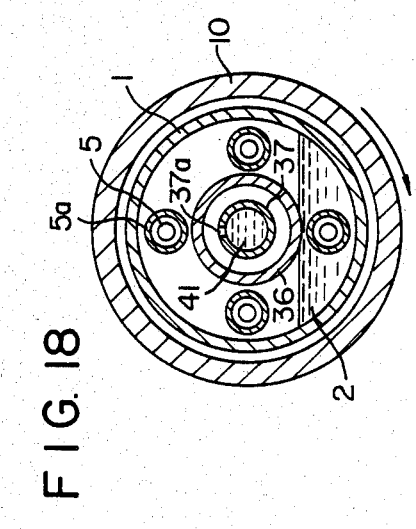
FIG. 18 is a cross-sectional view of a substrate, a mandrel, and heaters in the vacuum evaporation apparatus shown in FIG. 17.

FIGS. 17 and 18 illustrate a vacuum evaporation apparatus according to still another embodiment, having a cooling means for cooling a substrate after a film has been deposited thereon by forcibly circulating a coolant such as water within a mandrel. As shown in FIG. 17, the mandrel 1 has a sealed space 34 containing a heat medium 2 (hereinafter referred to as a "first heat medium"), and a pipe-shaped container 36 hermetically sealed from the space 34 is disposed therein. The container 36 and a pipe 37 disposed therein jointly define a cooling circulation path as described below.

The container 36 and the pipe 37 are joined to a right-hand (as shown) rotary joint 38. Water 41 serving as a second heat medium and also a coolant flows through a valve 39 and the rotary joint 38 into the pipe 37 and then is ejected as water streams through nozzle orifices 37a against an inner wall of the pipe-shaped container 36. When the water streams are thus ejected, a latent heat is absorbed on evaporation of the coolant water, and a large amount of heat can then be transferred efficiently. Stated otherwise, heat exchange is carried out between the system of the first heat medium 2 and the system of the second heat medium 41 for cooling a tubular substrate 10 and the mandrel 1 efficiently within a short period of time. The interval of time required for a vacuum evaporation process is therefore reduced and the rate of production is increased.

The vapor and the remaining heat medium 41 flow through the pipe-shaped container 36 and are discharged through a discharge pipe 42 out of the vacuum evaporation apparatus. Thus, the container 36 and the pipe 37 provide the cooling circulation passage for allowing the second heat medium 41 to go into and out of the vacuum evaporation apparatus.

The cooling efficiency is increased when the water is ejected from the pipe 37 as atomized droplets. Accordingly, the smaller the diameters of the nozzle orifices 37a and the more the nozzle orifices 37a, the higher the cooling efficiency. Since, however, the small diameters of the nozzle orifices tend to increase the resistance to movement of the coolant water in the pipe 37, the coolant water may be introduced into the pipe 37 under pressure.

Feeding the coolant water into the pipe 37 under higher pressure can cool the substrate more rapidly as more heat is transferred for cooling the substrate. When the coolant water is fed under lower pressure or intermittently, the substrate can be cooled at a lower speed. This controls the rate of cooling the substrate for optimizing the sensitivity of a photosensitive body of selenium, for example, which is depenent on the cooling rate.

An experiment was conducted in which tap water was used as the second heat medium. The tap water was fed into the pipe 37 under its normal pressure, and the diameter of each nozzle orifice 37a was about 5 mm. The substrate was sufficiently quickly cooled by evaporation of the coolant water even taking into account the viscosity of water and the frictional resistance of the pipe to the flow of water.

Figure 19:
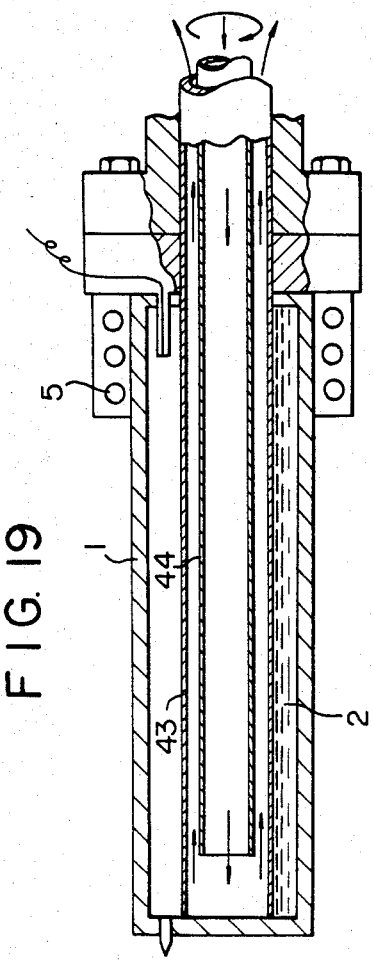
FIG. 19 is a partly cross-sectional view of a vacuum evaporation apparatus according to a still further embodiment, having a different means for forcibly circulating a cooling medium.

According to a still further embodiment shown in FIG. 19, a first heat medium 2 is sealed in a mandrel 1 serving as a sealed container and can be heated by a heater 5 disposed around the mandrel 1. The mandrel 1 has a sealed space in which there is disposed an outer pipe 43 hermetically sealed from the sealed space. An inner pipe 44 is disposed in the outer pipe 43. The apparatus illustrated in FIG. 19 is rotatable in a vacuum chamber as in the previous embodiments. A tubular substrate (not shown) on which a film is to be deposited through vacuum evaporation can be fitted over the mandrel 1.

With the illustrated cooling arrangement, the second heat medium flows into the inner pipe 44 and then is discharged out through the outer pipe 43. Thus, the outer pipe 43 and the inner pipe 44 jointly define a cooling circulation path for passage therethrough of the second heat medium to cool the mandrel 1 and the tubular substrate in a short period of time.

Figure 20:
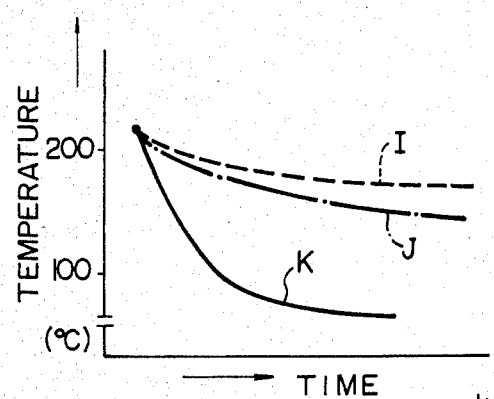
FIG. 20 is a graph showing, for comparison, time-dependent temperature drops in substrates as they are cooled in the vacuum evaporation apparatus shown in FIGS. 4, 17 and 19.

FIG. 20 shows the temperatures of substrates as they are lowered with time as the cooling of them progresses. The temperature curve shown by the dotted line I was plotted when the substrate was cooled by the cooling system shown in FIG. 4, the temperature curve by the dot-and-dash line J was drawn when the substrate was cooled by the cooling system illustrated in FIG. 19, and the temperature curve by the solid line K was drawn when the substrate was cooled by the cooling system illustrated in FIG. 17.

The graph of FIG. 20 indicates that the cooling arrangement of FIG. 19 (giving the temperature curve J) is better than the cooling system of FIG. 4 for cooling efficiency. With the cooling system shown in FIG. 19, higher cooling efficiency is gained when a heat medium or a coolant used has a larger temperature drop in a unit time. FIG. 20 also shows that the cooling system of FIG. 17 (the temperature curve K) utilizing ejection and vaporization of the coolant is better for cooling efficiency than the cooling arrangement of FIG. 19 (the temperature curve J) in which the coolant is simply caused to flow through the circulation path.

According to an experiment carried out by the inventors, an aluminum pipe employed as a substrate was heated to 200° C., and thereafter water was ejected as atomized droplets against the inner wall of the pipe-shaped container 36 (see FIG. 17). The aluminum pipe was then cooled rapidly down to 100° C. (see FIG. 20). The aluminum pipe was cooled to a lower temperature than 100° C. though the rate of cooling was lowered.

As the second heat medium, there may be used a heat medium having a higher boiling point and a heat medium having a lower boiling point, and the former heat medium may be fed into the circulation path at a first stage, and then the latter heat medium may be fed into the circulation path at a second stage for higher cooling efficiency.

More specifically, in FIG. 17, the heat medium of higher boiling point such as water or oil is first supplied into the pipe 37 to effect first-stage cooling by utilizing heat transfer due to the heat of vaporization of this heat medium, and then the heat medium of lower boiling point is fed into the pipe 37 at a second stage. The heat medium of lower boiling point is vaporized in a temperature range (100° C. or less with water) lower than the boiling point of the heat medium of higher boiling point, and the heat of vaporization generated effects second-stage cooling for thereby cooling the substrate quickly.

If the heat medium of lower boiling point were first introduced into the pipe 37, then the heat medium would be vaporized abruptly, and would be decomposed and degraded through exposure to the high temperature environment. Therefore, it is more advantageous to rely on the two-stage vaporization process in which the heat medium of higher boiling point and then the heat medium of lower boiling point is introduced into the pipe 37.

Figure 21:
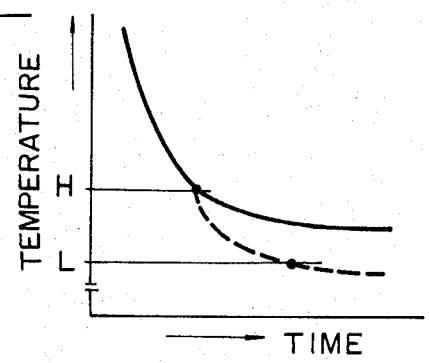
FIG. 21 is a graph showing a time-dependent temperature drop in a substrate as it is cooled in a two-stage evaporation process in the vacuum evaporation apparatus shown in FIG. 17.

FIG. 21 is a graph showing the temperature of a substrate as its goes down with time while the substrate is being cooled by the two-stage vaporization process. Designated at H is a boiling point of the higher-boiling-point heat medium, and L a boiling point of the lower-boiling point heat medium. Study of FIG. 21 clearly shows that the substrate can be quickly cooled below the boiling point H as indicated by the dotted line.

When the heat medium of higher boiling point is introduced at the first stage, and then continuously the heat medium of lower boiling point is introduced at the second stage, both of the heat mediums tend to be mixed with each other in the circulation path. To cope with this, two separate cooling pipes may be provided for passage therethrough of the two heat mediums, respectively.

The heat medium of higher boiling point may comprise an oily heat medium which is commercially available or water. The heat medium of lower boiling point may comprise Freon (trademark), alcohol, esters, ethers, or hydrocarbon liquids. Any heat medium combinations can be used provided they have different boiling points and will not corrode the pipe. The combination of water and Freon (trademark) is a practical choice desirable in the interest of cost and ease of handling.

With the foregoing embodiments, the substrate on which a thin film has been deposited can be cooled effectively, and the cooling operation also allows the thin film to be deposited uniformly and makes the vacuum evaporation apparatus ready for a next cycle of vacuum evaporation. The following cycle of vacuum evaporation is prepared by removing the bell jar 15 (FIG. 4), detaching the cooled substrate with the film deposited thereon, mounting a new tubular substrate on the mandrel 1, setting the bell jar 15 again, and developing a vacuum in the bell jar 15.

In the preceding embodiments, the heat medium in the mandrel 1 is heated by the heater disposed inside or outside of the mandrel 1. However, the heat medium in the mandrel 1 may be heated by an induction heating system as described below.

Figure 22:
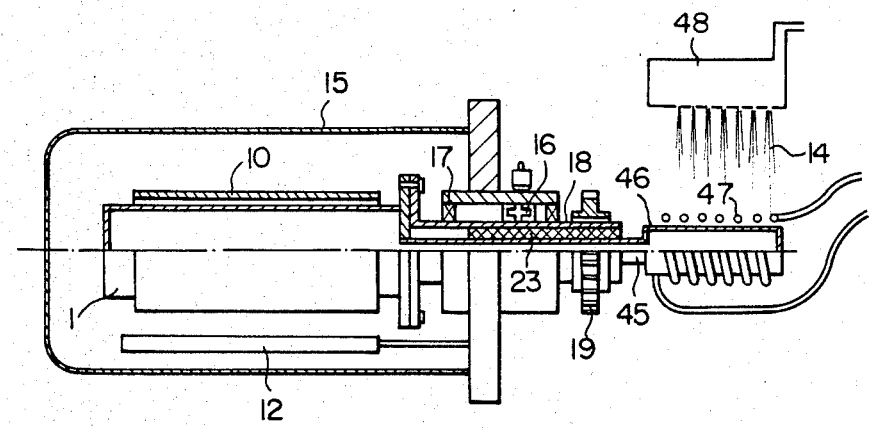
FIG. 22 is a partly cross-sectional view of a vacuum evaporation apparatus according to another embodiment, having a heating means in the form of an induction coil.

As shown in FIG. 22, a conduit 45 has one end joined to a mandrel 1 and is disposed in a tubular rotatable shaft 18 in coaxial relation to the mandrel 1. The other end of the conduit 45 projects out of the rotatable shaft 18 and is joined to a closed heating and cooling cylinder 46. The heating and cooling cylinder 46, the mandrel 1, and the conduit 45 jointly provide an integral closed container. A thermal insulator 23 is interposed between the conduit 45 and the rotatable shaft 18.

The heating and cooling cylinder 46 is made of a ferromagnetic material such as iron, for example, with an induction coil 47 wound therearound in closely spaced relation. The induction coil 47 generates an alternating magnetic field in response to an alternating current supplied thereto from a power supply (not shown). When subjected to the alternating magnetic field, the heating and cooling cylinder 46 generates heat due to an eddy-current loss caused by an eddy current produced by the electromagnetic induction and also generates heat due to a hysteresis loss caused because the heating and cooling cylinder 46 is made of a ferromagnetic material.

A nozzle 48 is disposed adjacent to and radially outwardly of the heating and cooling cylinder 46 for ejecting a coolant 14 such as water to cool the heating and cooling cylinder 46.

For vacuum evaporation, a drive gear 19 is driven to rotate the rotatable shaft 18, the mandrel 1, a tubular substrate 10, and the conduit 10 in unison, and an electric current is passed through the induction coil 47. The heating and cooling cylinder 46 is heated by the eddy-current loss and the hysteresis loss to heat a heat medium (not shown) in the mandrel 1. The heat medium thus heated is vaporized and the vapor gas is moved between lower- and higher-temperature regions due to a heat transfer to thereby heat the surface of the mandrel 1 uniformly. The tubular substrate 10 is then heated uniformly to allow an evaporant evaporated from a heating crucible 12 to be evenly deposited on the surface of the tubular substrate 10.

After the vacuum vaporization at a high temperature, the tubular substrate 10 is required to be cooled down to a prescribed temperature in a vacuum environment. To effect this, the coolant 14 is ejected from the nozzle 48 to cool the heating and cooling cylinder 46 on its outer peripheral surface. Then, the heat medium 2 kept at a high temperature and having a high latent heat within the heating and cooling cylinder 46 is quickly cooled and converted from a gaseous phase into a liquid phase. At this time, there is developed a pressure difference between the liquid phase and the remaining gaseous phase, thereby causing the high-temperature gas to be progressively moved from the mandrel 1 into the heating and cooling cylinder 46 due to a heat transfer, and the mandrel 1 is cooled bodily from its interior.

With the induction heating system for heating the heat medium in the mandrel 1, the amount of heat can easily be controlled as desired by selecting or adjusting the material, diameter and thickness of the heating and cooling cylinder 46, the number of turns of the induction coil 47, the frequency of the alternating current supplied, or the space between the induction coil 47 and the heating and cooling cylinder 46. This enables optimum and effective heating control to suit the size of the vacuum evaporation apparatus, the kind of an evaporant, and other factors.

Figure 23:
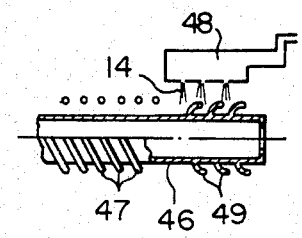
FIG. 23 is a fragmentary cross-sectional view of a conduit projecting from a vacuum evaporation apparatus and divided into cooling and heating sections.

FIG. 23 shows another embodiment in which a heating and cooling cylinder 46 is divided into a heating section and a cooling section which are axially displaced from each other.

More specifically, an induction coil 47 is wound around the heating and cooling cylinder 46 closely to a mandrel (not shown), and a nozzle 48 is located adjacent to and radially outwardly of the heating and cooling cylinder 46 remotely from the mandrel for ejecting a coolant 14 toward the heating and cooling cylinder 46. The heating and cooling cylinder 46 has heat radiation fins 49 positioned in radially aligned relation to the nozzle 48 for providing increased cooling efficiency and preventing the coolant 14 as ejected from flowing toward the induction coil 47.

In the embodiment of FIG. 22, the induction coil 47 needs to be electrically insulated as the coolant 14 is ejected directly over the induction coil 47. However, no such electrical insulation is necessary with the embodiment shown in FIG. 23. The induction coil 47 has no danger of getting deteriorated due to the cooling action.

With the embodiments of FIGS. 22 and 23, the induction heating system allows a quick temperature rise, and the amount of heat radiated can be controlled as desired by adjusting the frequency of the alternating current and other factors for optimum and effective temperature control. The mandrel 1 can also be cooled by the same heating and cooling cylinder 46.

Vacuum evaporation apparatus of the type described are normally equipped with a temperature sensor for detecting the temperature of a heated substrate to control the substrate temperature in a prescribed temperature range based on temperature information thus detected. In such a temperature detection system, lead wires extending from the temperature sensor are required to be led out of the vacuum evaporation apparatus without impairing the hermetically sealed condition in the bell jar. An embodiment that follows is designed to meet the above requirement, the lead wires being connected to an instrument (described later) located outside of the vacuum evaporation apparatus through a brush device.

Figure 24:
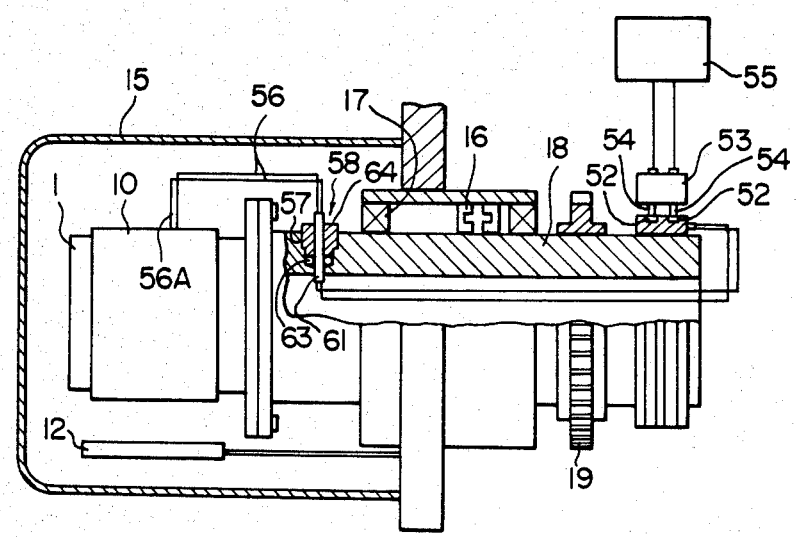
FIG. 24 is a partly cross-sectional view of a vacuum evaporation apparatus according to still another embodiment in which lead wires from a temperature sensor are led out of a vacuum chamber without imparing its hermetically sealed condition.

As illustrated in FIG. 24, slip rings 52 are mounted on and around an end of a tubular rotatable shaft 18. A brush holder 53 is disposed adjacent to and radially outwardly of the slip rings 52 and supports two brushes 54 having lower ends held in sliding contact with the slip rings 52, the brushes 54 being connected to an instrument 55. Two thermocouple wires 56 are connected respectively to the slip rings 52. The tubular rotatable shaft 18 has a lead wire guide hole 57 defined therein at a position within a bell jar 15. A lead wire guide 58 is inserted in the lead wire guide hole 57.

The thermocouple wires 56 extend through the rotatable shaft 18 and the lead wire guide 58 into the bell jar 15 in which the thermojunction of the thermocouple wires 56 is located near a tubular substrate 10. The instrument 55 measures a thermoelectromotive force developed due to a temperature difference between the thermojunction and reference junction of the thermocouple wires 56 for detecting the temperature of the tubular substrate 10. The temperature information as detected by the instrument 55 is supplied to a control circuit (not shown) which controls the amount of heat supplied by the heater 5 (see FIGS. 17 and 19) to the heat medium in the mandrel based on the supplied temperature information, thereby keeping the tubular substrate 10 in a prescribed temperature range.

Figure 25:
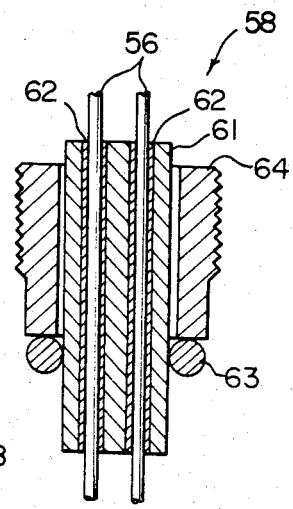
FIG. 25 is an enlarged cross-sectional view of a lead wire guide in the vacuum evaporation apparatus illustrated in FIG. 24.

As shown in FIG. 25, the lead wire guide 58 comprises a support tube 61 made of an electrically insulating material with the thermocouple wires 56 extending therethrough. A mass 62 of sealing synthetic resin is filled between the thermocouple wires 56 and the inner walls of the support tube 61. The sealing synthetic resin may comprise a sealant containing silicone rubber.

Figure 26:
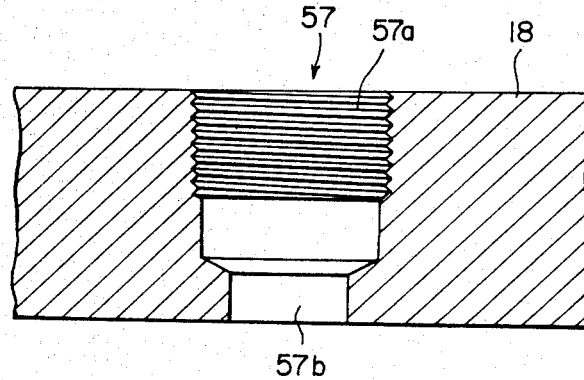
FIG. 26 is a fragmentary cross-sectional view of a lead wire guide hole in which the lead wire guide of FIG. 25 is inserted.

In FIG. 26, the lead wire guide hole 57 defined in the tubular rotatable shaft 18 includes a larger-diameter threaded hole 57a and a smaller-diameter hole 57b.

Figure 27:
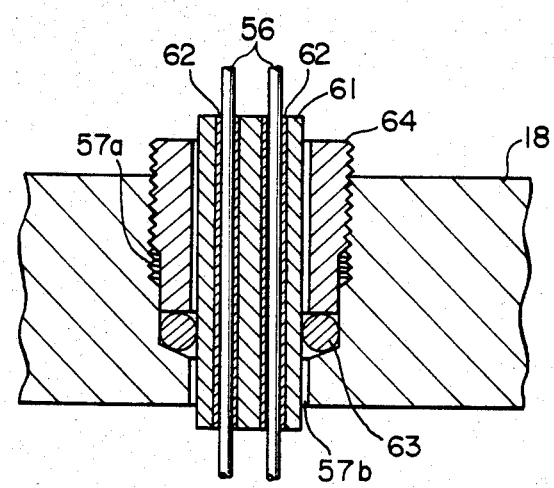
FIG. 27 is a fragmentary cross-sectional view of the lead wire guide of FIG. 25 threaded in the lead wire guide hole of FIG. 26.

As illustrated in FIG. 27, the support tube 61 is disposed in the lead wire guide hole 57. A seal ring 63 is tightly disposed around the support tube 61. A retaining screw 64 having an axial through hole is threaded in the larger-diameter threaded hole 57a of the lead wire guide hole 57 and is fitted over the support tube 61. The retaining screw 64 has an end pressing the seal ring 63 against a boundary wall between the larger-diameter threaded hole 57a and the smaller-diameter hole 57b. The seal ring 63 and the mass 62 of sealing synthetic resin serve to cut off communication bewteen the exterior and interior of the tubular rotatable shaft 18 for hermetically sealing the interior of the bell jar 15. The thermocouple wires 56 led out through the lead wire guide 58 do not impair the hermetically sealed condition of the bell jar 15.

In the above embodiment the temperature of the tubular substrate is detected by the temperature sensor in the form of a thermocouple. The amount of heat supplied by the heater 5 to the heat medium 5 may be controlled on the basis of temperature information obtained as a result of detecting the temperature of the mandrel 1 itself.

Figure 28:
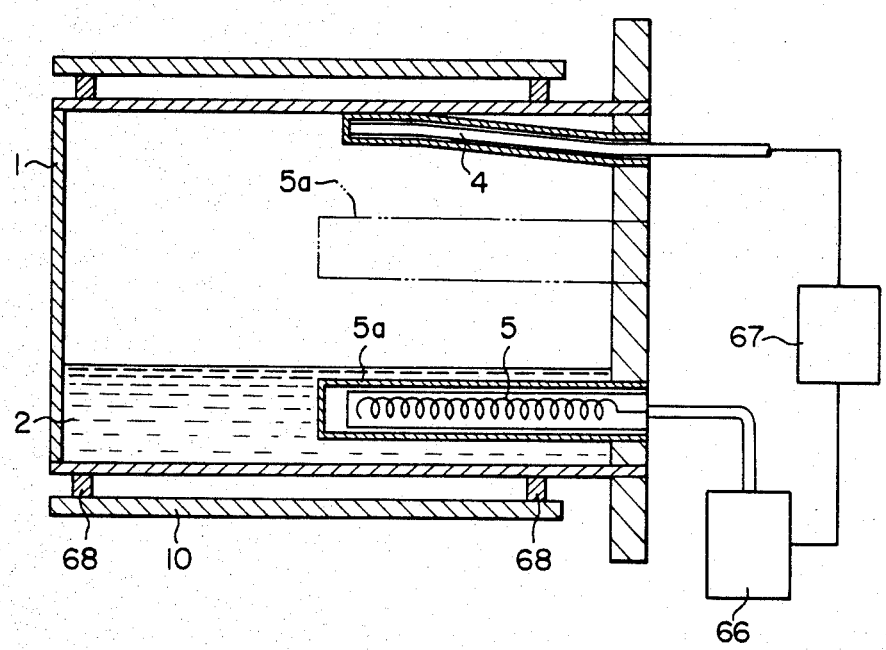
FIG. 28 is a cross-sectional view of a vacuum evaporation apparatus according to another embodiment in which a mandrel temperature sensor is held in contact with a mandrel.
Figure 29:
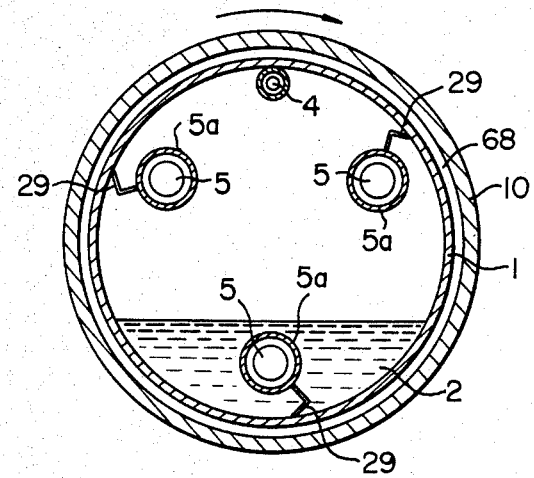
FIG. 29 is a cross-sectional view of the mandrel, the mandrel temperature sensor, and heaters in the vacuum evaporation apparatus shown in FIG. 28.

FIGS. 28 and 29 illustrate such an alternative embodiment. A cylindrical mandrel 1 has both ends closed and houses therein three heaters 5 such as sheathed heaters for heating a heat medium 2 in the mandrel 1. The heaters 5 are mounted in respective heater protection pipes 5a and positioned in angularly equidistant relation. The temperature in the mandrel 1 can be detected by a temperature sensor 4 comprising, for example, a sheathed thermocouple disposed in the mandrel 1.

As shown in FIG. 28, the temperature sensor 4 is connected through a controller 67 to a power supply 66 for the heaters 5 for controlling the amount of heat supplied by the heaters 5 to the heat medium 2 based on a signal representative of the detected temperature. As shown in FIGS. 28 and 29, the temperature sensor 4 has a distal end held in intimate contact with the inner surface of the mandrel 1 for reliable detection of the mandrel temperature. Each of the heater protection pipes 5a has on its outer peripheral surface an L-shaped scoop-up vane 29 for scooping and stirring the liquid heat medium 2 when the mandrel 1 rotates in the direction of the arrow (FIG. 29) to thereby prevent the outer surfaces of the heater protection pipes 5a from being locally dried up.

The mandrel 1 thus constructed and a non-illustrated heating crucible are housed in a bell jar 15 (see FIG. 22) for developing a vacuum therein. A tubular substrate 10 is mounted on and around the mandrel 1 through ring-shaped intermediate thermal conductors 68 as shown in FIG. 28.

To effect vacuum evaporation, the heaters 5 are energized by the power supply 66 to heat the heat medium 2 in the mandrel 1 up to a predetermined temperature based on a detected temperature signal fed from the temperature sensor 4. The heat medium 2 thus heated is vaporized into a vapor gas which, having absorbed heat of evaporation, is moved into a region of lower temperature in the mandrel 1. The vapor gas in the region of lower temperature then becomes supersaturated and is turned into a liquid. The thermal energy borne as latent heat by the vapor gas is given off to heat the mandrel 1 to keep the latter in a balanced temperature.

Figure 30:
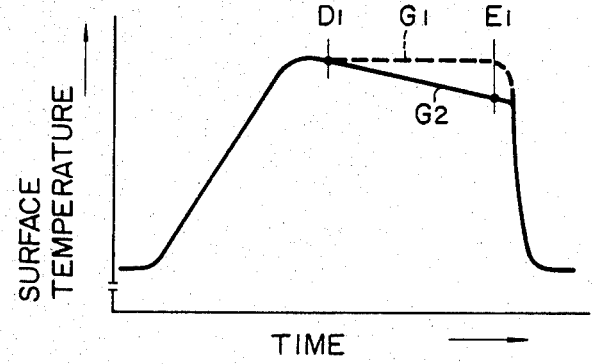
FIG. 30 is a graph showing time-dependent variations in the temperatures of a heat medium and a substrate according to a conventional high-temperature liquid heat medium circulation process.

The mandrel 1 is therefore heated to a uniform surface temperature and thus the tubular substrate 10 is also heated uniformly.

Where the mandrel is heated by a conventional high-temperature liquid medium circulation method utilizing a liquid medium heated to a constant temperature, the temperature of the heat medium is constant at all times as shown by the dotted-line curve G1 in FIG. 30, and the temperature of the substrate is lowered gradually with time as shown by the solid-line curve G2 due to a heat loss resulting from contact between the mandrel and the substrate, poor thermal conduction resulting from a gap (vacuum) defined by the intermediate thermal conductors 68 between the mandrel and the substrate, or heat discharge from the substrate into the vacuum space.

One solution to this problem is to press the tubular substrate 10 radially inwardly (as shown in FIG. 28) to increase the pressure of contact between the tubular substrate 10 and the intermediate thermal conductors 68, or to enlarging the size of the intermediate thermal conductors 68 until they have a size equal to that of the tubular substrate 10. However, this attempt is merely effective in preventing a small temperature drop. As the temperature is lowered, an evaporated layer m (FIG. 31) deposited on the substrate 10 (which is an electrically conductive base) has portions or levels marked with D, E which have different negatively charged characteristics, different color sensitivities, and different darkdecay characteristics in case the deposited layer is employed as a photosensitive layer. This is disadvantageous in that the photosensitive layer will change its various characteristics as it wears down to a level E' while it is run for a long period of time (a thickness in the range from 3 to 6 microns is worn out after eighty thousand copies have been duplicated on the photosensitive layer).

This appears to be caused in view of the fact that, where the deposited layer is a single layer of Se, the chains of Se - Se have different lengths in the transverse direction of the layer (a property which holds true for $As_2Se_3$), and the condition of deposition of the evaporated material (Se or the like) varies in the transverse direction of the layer.

More specifically, the glass transition point $As_2Se_3$ is in the range from 180° C. to 200° C. though measured values vary from researcher to researcher or measurer to measurer. Therefore, when an Se material is deposited on the base at a lower temperature in a vacuum, the heat is absorbed by the base at the time the material is deposited and the evaporated layer is solidified before it becomes sufficiently dense. Conversely, when the temperature of the base is comparatively high (about 200° C. for $As_2Se_3$), only a small amount of heat is absorbed from the deposited Se material into the base, and the deposited layer tends to flow due to a surface motion prior to solidification, so that the energy of the layer is uniformized. Therefore, molecules, atoms, and atom groups are subjected to fewer pores and the resultant photosensitive layer is rendered more dense.

According to the prior art, the temperature of the base at a time D1 when the vacuum evaporation is started is different from that at a time E1 when the vacuum evaporation approaches an end, and the base temperature gradually decreases with time as shown by the solid-line curve G2 in FIG. 30. Therefore, sufficient surface motions for layer uniformization tend to be more difficult to occur toward the free surface, and the property of a deposited photosensitve layer changes in the transverse direction of the layer.

Figure 32:
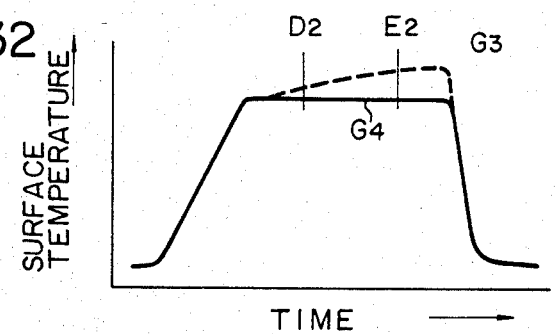
FIG. 32 is a graph illustrative of time-dependent variations in the temperatures of a heat medium and a substrate according to a heat-pump process of the present invention.
Figure 33:
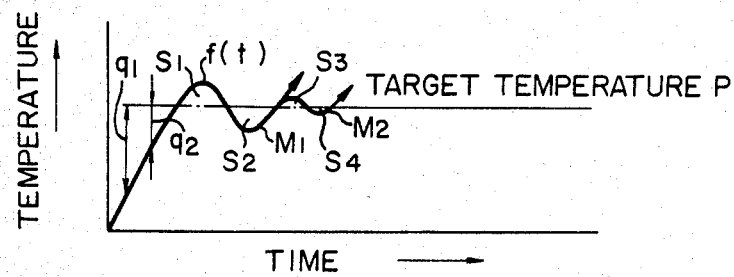
FIG. 33 is a graph showing a temperature control method using a controller.

With the heat pump system using the heat medium 2 as shown in FIGS. 28 and 29, the heat medium 2 is turned into a vapor gas for heat exchange, and this enables temperature control of the heat medium 2 as shown by the dotted line G3 in FIG. 32 through an increase in the amount of heat supplied from the heaters 5 to the heat medium 2. Consequently, the temperature of the substrate can be controlled at a constant level as shown by the solid-line curve G4 in FIG. 32.

This temperature control is carried out by enabling the controller 67 to control the amount of an electric current to the heaters 5 based on a temperature-indicative signal from the temperature sensor 4 shown in FIG. 28 or the temperature sensor 56A shown in FIG. 24. The temperature control effected by the controller 67 will be described.

When the temperature as detected by the temperature sensor 4 deviates largely by q1 from a target temperature P, the controller 67 applies an increased input power P1. When the deviation is small at q2 (q1 > q2), the controller 67 reduces the input power to P2 (=q2/q1×P1). Under this control, the temperature goes up quickly until it reaches the target temperature, and can arrive at the target temperature with small overshoots.

The controller 67 utilizes a signal of $S = \int \{f(t) - P\}dt$ as a control command, and effects control operation by increasing an energizing power PM1 at a point M1 where there is a large deviation S2, and reducing an energizing power PM2 (=S4/S2×PM1) at a time M2 where there is a small deviation S4 (S2 > S4). Thus, the detected temperature can be controlled into the target temperature P in a short period of time.

The temperature of the base can therefore be controlled at a constant level during an interval of time from D2 at the start of the vacuum evaporation to E2 at the end thereof as shown by the solid-line curve G4 in FIG. 32, so that the photosensitive layer bulk will have constant characteristics across the thickness thereof.

Figure 31:
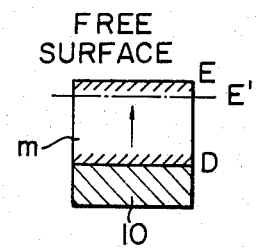
FIG. 31 is a diagram showing an evaporated layer deposited on a substrate.

Free control of the base temperature allows a photosensitive body to be manufactured such that the sensitivity in the vicinity of the surface as shown by E in FIG. 31 will be quickly responsive while that in the vicinity of the base as shown by D will be slowly responsive, or conversely the sensitivity in the vicinity of the surface will be slowly responsive or that in the vicinity of the base will be quickly responsive. As a consequence, the sensitivity distribution across the thickness of the photosensitive layer can easily be selected. There can easily be fabricated a photosensitive body for use in electrophotographic copying machines which has a desired sensitivity, a desired chargeability, and desired darkdecay characteristics.

Figure 34:
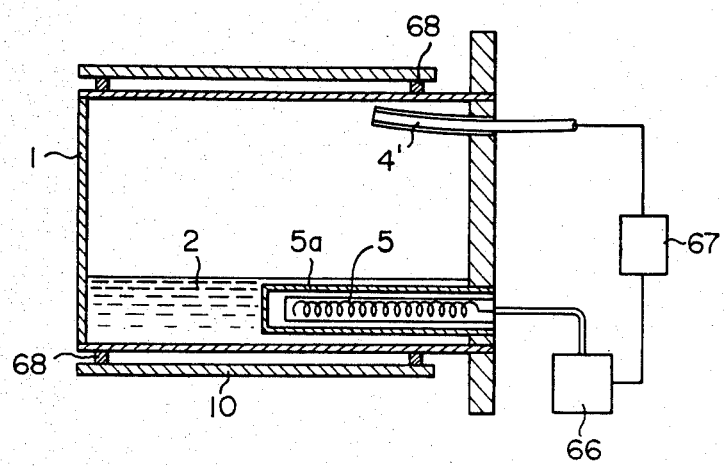
FIG. 34 is a cross-sectional view of a mandrel device utilized in describing the advantage accruing from intimate contact between the temperature sensor and the mandrel inner surface.

A temperature sensor 4' shown in FIG. 34 has a distal end held out of contact from the inner surface of a mandrel 1. The temperature sensor 4' is capable of measuring the temperature of a vaporized heat medium 2 in the mandrel 1 for easy detection of temperatures in a steady state. The distal end of the temperature sensor 4' however tends to be dried by the heat radiated from the heaters 5 or wetted by the liquid heat medium 2 while the mandrel 1 is rotating. When the temperature sensor 4' that has been wet is dried, the distal end thereof is subjected to a sudden temperature rise due to direct heat radiation from the heaters 5 as they are brought out of the heat medium 2 notwithstanding that the interior condition of the mandrel 1 remains substantially the same temperature. At this time, the temperature sensor 4' issues a signal indicating an abnormally high temperature to the controller 67 which then controls the heaters 5 to produce a reduced amount of thermal energy. This fails to effect correct temperature control as the temperature of the mandrel 1 or the tubular substrate 10 is gradually lowered though the temperature of the distal end only of the sensor 4' approaches the target temperature.

Since the temperature sensor 4 shown in FIG. 28 has its distal end held against the inner surface of the mandrel 1, the temperature sensor 4 can detect the temperature of the mandrel 1 at all times for stable temperature control.

The temperature sensor 4' is also capable of performing stable temperature control by winding a mesh around its distal end or forming a liquid reservoir in the distal end to keep the sensor 4' wet with the heat medium 2 at all times.

Figure 35:
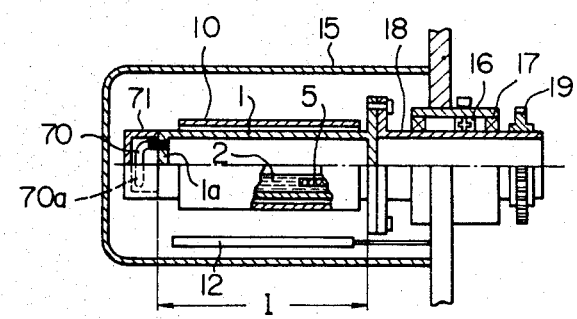
FIG. 35 is a partly cross-sectional view of a vacuum evaporation apparatus according a still further embodiment in which a pipe for discharging an incondensable gas is connected to a mandrel.

When a tubular substrate 10 as shown in FIG. 35 is to be heated uniformly throughout its axial length, any incondensable gas such as air trapped in the mandrel 1 due for example to insufficient de-airing, insufficient sealing, or thermal decomposition of a small amount of the heat medium 2 during operation over a long period of time makes the mandrel 1 irregular in its surface temperature distribution.

Figure 38:
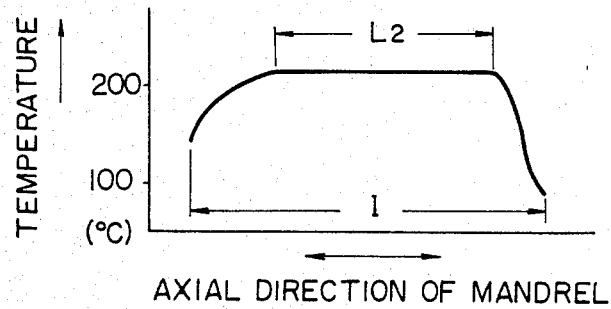
FIG. 38 is a graph showing a temperature distribution of a mandrel at the time when there is an increased amount of incondensable gas.

Experiments effected to determine a temperature distribution on a vacuum evaporation mandrel revealed that the mandrel exhibited a uniform temperature distribution along the entire axial length of the mandrel when there was only a small amount of incondensable gas in the mandrel, but the mandrel had its ends subjected to lower temperatures and a shortened uniform-temperature zone when there was an increased amount of incondensable gas in the mandrel, as shown in FIG. 38. Designated in FIG. 38 at L1, L2 are zones of uniform temperature, and a length l in the axial direction of the mandrel 1.

With the vacuum evaporation apparatus as shown, when a heat medium 2 is heated by heaters 5 in the mandrel 1 serving as a sealed container, any incondensable gas present in the mandrel 1 tends to be forced toward the ends of the mandrel 1 by the vapor of the heat medium. Therefore, the temperature of the portion of the mandrel 1 which is filled with a heat medium vapor available for condensation heat transfer is of uniform distribution, However, the heat medium vapor fails to reach the ends of the mandrel 1 where greater amount of incondensable gas is present, and the mandrel ends are not heated to a higher temperature as the amount of condensation heat transferred by the heat medium vapor is reduced in the mandrel ends.

As the incondensable gas is accumulated in the mandrel 1, the mandrel 1 cannot function effectively as the heater of uniform temperature.

By discharging the accumulated incondensable gas in the mandrel 1 which has impaired the uniformity of the surface temperature thereof, the mandrel 1 can serve as the effective heater with its surface temperature uniformized in the axial direction.

According to the embodiment shown in FIG. 35, a pipe 70 for discharging an incondensable gas is connected to the mandrel 1. The pipe 70 has one end communicating with the interior of the mandrel 1 and connected to a distal end 1a of the mandrel 1 in a hermetically sealed fashion. The other end 70a of the pipe 70 extends downwardly and is hermetically sealed from the exterior of the pipe 70. The sealed end 70a of the pipe 70 is released or opened only when the incondensable gas is to be discharged therethrough.

A cover 71 is removably attached to the mandrel 1 in covering relation to the pipe 70 for thereby preventing an evaporant emitted from a heating crucible 12 from getting attached to the pipe 70.

For discharging any incondensable gas accumulated in the mandrel 1, the mandrel 1 is heated up to a temperature higher than the boiling point of the heat medium 2, and the mandrel 1 is stopped in its rotation when the proximal end of the pipe 70 is located in an uppermost position as shown in FIG. 35. Thereafter, the sealed end 70a of the pipe 70 is cut off by a suitable tool such as nippers to allow the incondensable gas to be discharged therethrough under the internal pressure in the mandrel 1. During this operation, the bell jar 15 and the cover 71 are detached away from the mandrel 1.

After the incondensable gas has been discharged, the end 70a of the pipe 70 is deformed and welded until it is completely sealed again. The foregoing series of operations should be effected at a temperature higher than the boiling point of the heat medium 2. If done at a lower temperature, then the pressure in the mandrel 1 would be reduced, and air would enter through the cut-off end of the pipe 70 into the mandrel 1. The proximal end of the pipe 70 is located in the uppermost position as shown in FIG. 35 for the reason that the incondensable gas which tends to collect in the upper portion of the mandrel 1 can effectively be discharged through the pipe 70.

Figure 36:
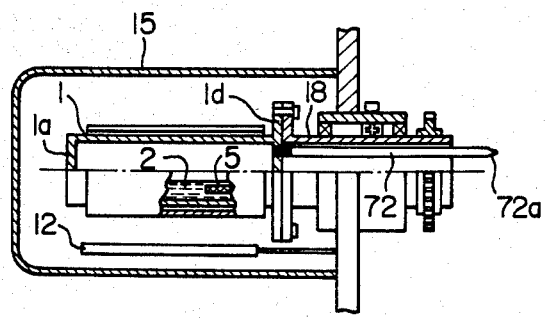
FIG. 36 is a partly cross-sectional view of a vacuum evaporation apparatus according to still another embodiment in which a pipe for discharging an incondensable gas has an end exposed out of the apparatus.

FIG. 36 illustrates another embodiment in which a mandrel 1 has a flange 1d remote from a distal end 1a of the mandrel 1, and a pipe 72 for discharging an incondensable gas has an end joined to the flange 1d. The pipe 72 extends through a tubular rotatable shaft 18 and an opposite end 72a projecting out of the vacuum evaporation apparatus and serving as a sealed end. For discharging any incondensable gas from the mandrel 1, the pipe 72 is positioned in an uppermost location, and the sealed end 72a of the pipe 72 is cut off to allow the incondensable gas to be discharged from the mandrel 1 therethrough. After the gas has been discharged, the end 72a of the pipe 72 is sealed again.

Figure 37:
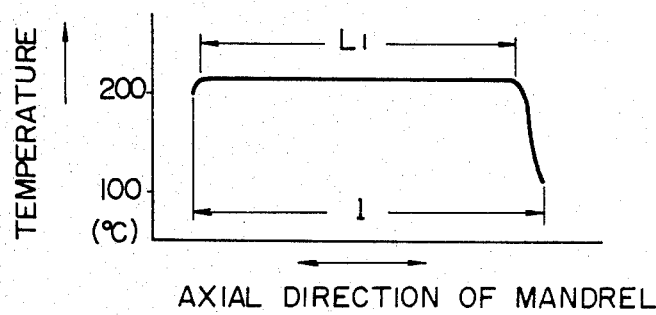
FIG. 37 is a graph showing a temperature distribution of a mandrel at the time when there is a reduced amount of incondensable gas.

With the embodiment of FIG. 35, the bell jar 15 has to be removed when discharging an incondensable gas from the mandrel 1. However, any incondensable gas can be discharged from the mandrel 1 of FIG. 36 while the bell jar 15 remains attached after the gas has been removed from the bell jar 15. With the bell jar 15 attached during discharging operation, the amount of heat radiation from the mandrel 1 into atmosphere is smaller than when the bell jar 15 would be removed, resulting in a longer period of time available for discharging the incondensable gas from the mandrel 1. By employing the relatively simple means for discharging any incondensable gas from the mandrel 1, the zone of uniform temperature can be increased from L2 (FIG. 38) to L1 (FIG. 37) for enabling mandrel 1 to act as an effective heater for heating a substrate in a wider uniform temperature zone.

According to the previous embodiment of FIG. 4, the mandrel 1, the conduit 21, and the cooling cylinder 22 are integrally constructed as a closed container, and the cooling cylinder 22 is cooled as by cold water ejected from the nozzle 24 for homogenizing the deposited layer on the substrate and preparing for a next cycle of vacuum evaporation.

When any incondensable gas is accumulated in the closed container as shown in FIG. 4, the incondensable gas tends to collect in the ends of the mandrel 1 and is also trapped in the cooling cylinder 22. The heat transfer capability of the cylinder 22 is then impaired and the mandrel 1 cannot be cooled effectively.

To cope with this problem, therefore, a pipe may be connected to the mandrel 1 for discharging the incondensable gas from the mandrel 1, with the results that the heat transfer capability of the cooling cylinder 22 is improved for effectively cooling the mandrel 1 uniformly.

According to the embodiment of FIG. 17, the mandrel 1 accommodates therein the heaters 5 for heating the heat medium 2 and the cooling circulation path composed of the inner pipe 37 and the outer pipe 36, and the coolant such as water is passed through the cooling circulation path.

When any incondensable gas is accumulated in the mandrel 1 of FIG. 17, the temperature distribution over the cooling circulation path assumes the pattern as shown in FIG. 38, in which the amount of heat transferred to the coolant is small and the cooling efficiency is reduced in regions of low temperature. The rate of cooling is also reduced in the ends of the mandrel 1. The mandrel 1 having such a cooling system as shown in FIG. 17 may also be equipped with a pipe for discharging any incondensable gas from the mandrel 1 to thereby effectively cool the mandrel 1 uniformly.

In each of the embodiments described above, a tubular substrate for use as a photosensitive drum for electrophotography is employed as a base on which a thin film is to be deposited during vacuum evaporation. Rather than the tubular substrate, a substrate in the form of a flexible film may be used and an evaporant may be deposited on the flexible substrate to provide a belt-like photosensitive body.

Figure 39:
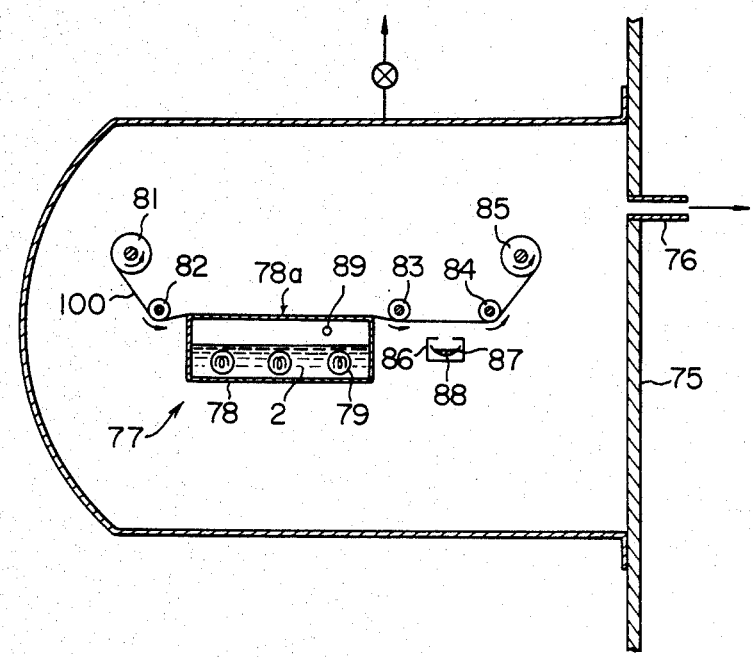
FIG. 39 is a cross-sectional view of a vacuum evaporation apparatus according to another embodiment, capable of depositing a film on a substrate such as a flexible film.

FIG. 39 shows a vacuum evaporation apparatus for depositing an evaporant on a flexible substrate to form a belt-like photosensitive body. The vacuum evaporation apparatus includes a bell jar 15 attached to a base plate 75 and a substrate heater 77 disposed in the bell jar 15 for heating a substrate 100. A vacuum will be developed in the bell jar 15 by a vacuum generating device connected bo a port 76 on the base plate 75.

The substrate heater 77 has a sealed container 78 having an upper flat heating surface 78a, a heat medium 2 such as of diphenyl or alkyl naphthalene sealed in the sealed container 78 after any incondensable gas has been discharged from the sealed container 78, and heaters 79 housed in the sealed container 78 for heating the heat medium 2. The heat medium 2 may be of other liquids or gases.

The substrate 100 is composed of an elongate web of film wound as a film roll 81. The substrate 100 as it is reeled off from the film roll 81 is guided by guide rollers 82, 83, 84 and wound around a takeup roller 85. The stretch of the substrate 100 between the guide rollers 82, 83 is held by these guide rollers in intimate contact with the upper heating surface 78a of the heater 77 and heated thereby. The stretch of the substrate 100 between the guide rollers 83, 84 is deposited with a thin film formed of an evaporant given off from an evaporant source 88 placed in a boat 87 located in a hood 86 positioned below the guide rollers 83, 84.

The heaters 77 in the substrate heater 77 vaporize the heat medium 2 into heat medium vapor which moves around in the container 78 for uniformly heating the upper heating surface 78a. The substrate 100 held in close contact with the upper heating surface 78a is also heated uniformly for allowing homogenous deposition of the evaporant on the substrate 100.

Figure 40:
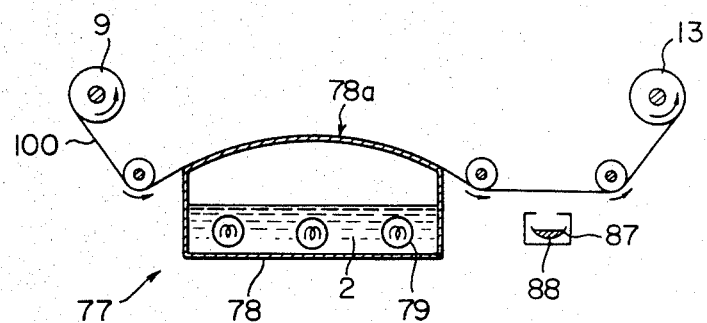
FIG. 40 is a cross-sectional view of a sealed container having a curved heating surface.

A temperature sensor 89 is disposed in a vapor space in the container 78 of the substrate heater 77 for detecting the vapor temperature in the container 78, there being a control circuit for determining any deviation of the detected temperature from a target temperature indicative of a proper temperature of the heated surface. When the detected temperature is higher than the target temperature, the control circuit operates to reduce the thermal energy output from the heaters 79. When the detected temperature is lower than the target temperature, the thermal energy output from the heaters 79 is reduced. The temperature sensor 89 may be placed in contact with any inner wall surface of the container 78. For increasing the thermal conduction efficiency, outer tube surfaces of the heaters or the inner wall surface of the container 78 may be roughened. The container 78 may have a curved heating surface 78a as shown in FIG. 40.

The substrate 100 is composed of a polyester film for use as a sheet-like or belt-like photosensitive body, but may comprise a resin film or a metal film which does not discharge much gas in a vacuum. Since any photosensitive body for use in electrophotography requires an electrically conductive layer below a deposited photoconductive film, resin films for use as the substrate 100 should be coated with a film of metal such as aluminum through vacuum evaporation. Thereafter, a photoconductive film is deposited on the deposited metal film.

Figure 41:
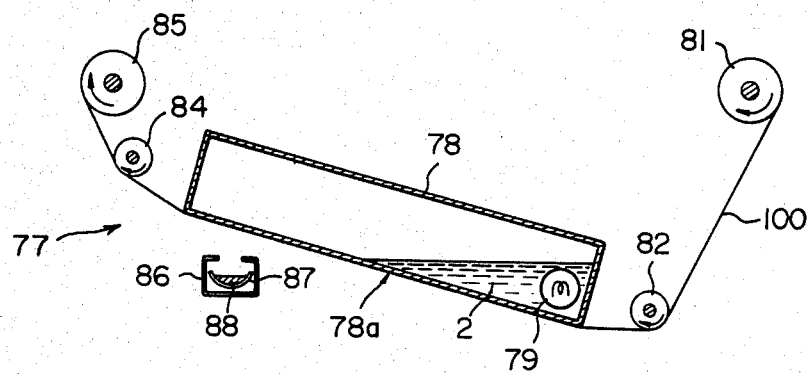
FIG. 41 is a cross-sectional view of an inclined sealed container with a heat medium sealed therein.

FIG. 41 shows a still further embodiment of the present invention. A sealed container 78 is inclined with an end thereof close to a film roll 81 of a substrate 100 being disposed downwardly. A heat medium 2 in the container 78 is displaced toward the film roll 81 so that the lower surface of the container 78 is divided into an exposed area and an area covered with the heat medium 2. The container 78 houses therein a heater 79 positioned over the heat-medium-covered area of the lower surface of the container 78. An evaporant source 88 in a boat 87 is accommodated in a housing 86 and disposed below the container 78 at the exposed area of its lower surface.

The substrate 100 is guided by guide rollers 82, 84 in contact with an entire lower heating surface 78a of the container 78 and is progressively wound up around a takeup roller 85. Therefore, the substrate 100 is preheated by the area of the heating surface 78a covered by the heat medium 2 and then fully heated by the exposed area of the heating surface 78a while the evaporant from the source 88 is deposited on the substrate 100.

Figure 42:
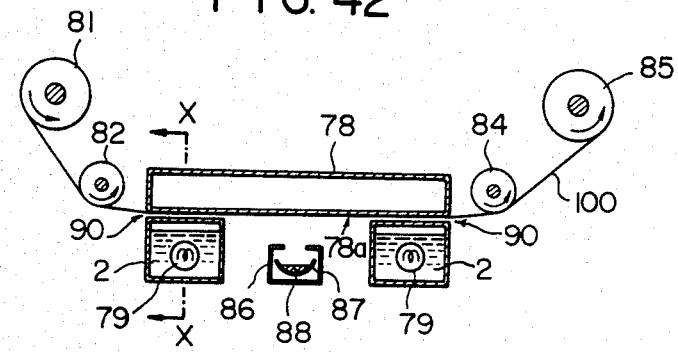
FIG. 42 is a cross-sectional view of a sealed container according to still another embodiment having divided sections for preheating a substrate and for fully heating the substrate for vacuum evaporation.
Figure 43:
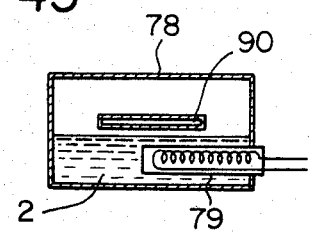
FIG. 43 is a cross-sectional view taken along line X—X of FIG. 42.

According to still another embodiment shown in FIGS. 42 and 43, a sealed container 78 has a pair of spaced legs housing therein heaters 79, 79, respectively, and each containing a heat medium 2. The spaced legs have slits 90 communicating with a central flat recess defined between the spaced legs, the slits 90 allowing a substrate 100 in the form of a flexible film to pass therethrough, the slits 90 and the central flat recess jointly defining a heating surface 78a. A boat 87 containing an evaporant source 88 is accommodated in a housing 86 positioned below the central flat recess and between the spaced legs. The heat medium 2 heated by the heaters 79 is vaporized and circulated in the container 78 to heat the heating surface 78a uniformly. The substrate film 100 guided by the guide rollers 82, 84 is preheated by the spaced legs of the container 78 and fully heated in the central flat recess between the spaced legs during which time the evaporant from the source 88 is deposited on the substrate film 100.

In the embodiments shown in FIGS. 39 through 43, the corners of the heating surface 78a against which the substrate 100 is brought into contact may be rounded to prevent the substrate 100 from being folded on itself when it is transported along. The guide rollers 82, 84 may be composed of heat pipes, and the upsteam guide roller 82 may be used to preheat the substrate 100 and the downward guide roller 84 may be employed to cool the substrate 100.

Since the substrate film can uniformly be heated, any thin film deposited thereon is of uniform quality and stable characteristics. The heating surface can be shaped to desired configurations, so that substrates of desired shapes can be employed with respect thereto.

Although certain preferred embodiments have been shown and described, it should be understood that many changes and modifications may be made therein without departing from the scope of the appended claims.

What is claimed is:

1. A vacuum evaporation apparatus for depositing an evaporant on a substrate in a vacuum chamber, comprising:
   (a) a substrate support for mounting thereon the substrate, said substrate support comprising a sealed container filled therein with a heat medium with any incondensable gas removed therefrom;
   (b) heating means for supplying heat to said heat medium in said substrate support to vaporize said heat medium;
   (c) wetting means including means on inner walls of said substrate support for wetting the walls and condensing the vaporized heat medium continuously thereon to effect thermal transfer of heat to said inner walls and uniformly heat said substrate support as said evaporant is deposited on said substrate; and
   (d) cooling means for cooling the substrate through said substrate support after the evaporant has been deposited on the substrate.

2. A vacuum evaporation apparatus according to claim 1, wherein the substrate is tubular, said substrate support comprising a mandrel in the form of a cylindrical sealed container for mounting thereon the tubular substrate.

3. A vacuum evaporation apparatus according to claim 1, wherein said heating means is disposed inside or outside of said substrate support.

4. A vacuum evaporation apparatus according to claim 1, wherein said cooling means comprises a conduit having one end communicating with said substrate support, a cooling cylinder mounted on an opposite end of said conduit and exposed out of the vacuum evaporation apparatus, and a coolant for cooling said cooling cylinder from the exterior thereof.

5. A vacuum evaporation apparatus according to claim 1, wherein said cooling means comprises a closed cooling container having one end disposed in said substrate support and an opposite end exposed out of the vacuum evaporation apparatus, a heat medium having a low boiling point sealed in said closed cooling container, and a coolant for cooling the exposed end of said closed cooling container from the exterior thereof.

6. A vacuum evaporation apparatus according to claim 1, wherein said cooling means comprises a cooling circulation path extending from the exterior of the vacuum evaporation apparatus into said substrate support, and a coolant contained in said cooling circulation path for forced circulation therethrough.

7. A vacuum evaporation apparatus according to claim 1, wherein said heating means comprises a conduit having one end communicating with said substrate support and an opposite end exposed out of the vacuum evaporation apparatus, and an induction coil for heating the exposed end of said conduit.

8. A vacuum evaporation apparatus according to claim 1, including a temperature sensor for detecting the temperature of the substrate or said substrate support.

9. A vacuum evaporation apparatus according to claim 1, including a pipe connected to said substrate support for discharging the incondensable gas therefrom.

10. A vacuum evaporation apparatus according to claim 2, wherein the tubular substrate with the evaporant having been deposited thereon can be used as a electrophotographic photosensitive drum.

11. A vacuum evaporation apparatus according to claim 2, wherein said mandrel has scoop-up vanes mounted on an inner wall surface.

12. A vacuum evaporation apparatus according to claim 2, wherein said mandrel has a porous layer mounted on an inner wall surface.

13. A vacuum evaporation apparatus according to claim 2, wherein said mandrel has a pattern of projections mounted on an inner wall surface.

14. A vacuum evaporation apparatus according to claim 2, wherein said mandrel has a mesh mounted on an inner wall surface.

15. A vacuum evaporation apparatus according to claim 5, wherein said closed cooling container is slidable with respect to said substrate support to vary its degree of projection into the substrate support.

16. A vacuum evaporation apparatus according to claim 6, wherein said cooling circulation path circulates therethrough a heat medium of higher boiling point in a first stage of cooling, and a heat medium of lower boiling point in a second stage of cooling.

17. A vacuum evaporation apparatus according to claim 7, wherein said exposed end of said conduit is divided into a heating section and a cooling section.

18. A vacuum evaporation apparatus according to claim 8, wherein said temperature sensor includes lead wires led out of the vacuum evaporation apparatus while retaining a hermetical seal in the vacuum chamber.

19. A vacuum evaporation apparatus according to claim 8, wherein said temperature sensor is held in contact with said substrate support.

20. A vacuum evaporation apparatus according to claim 9, wherein said pipe for discharging the incondensable gas has an end connected to said substrate support and an opposite end exposed out of the vacuum evaporation apparatus.

21. A vacuum evaporation apparatus according to claim 17, wherein said cooling section has heat radiation fins.

22. A vacuum evaporation apparatus comprising:
a bell jar forming a vacuum chamber;
a supporting member for supporting and forming a closed end of the bell jar;
a sealed mandrel which is rotatably mounted to the supporting member having means for heating and supporting a substrate on which an evaporant thin film is formed in the bell jar;
cooling means including a cylindrical member inserted in the mandrel;
a porous pipe housed in the cylindrical member and having means for jetting a cooling medium on inner walls of the cylindrical member;
means for supplying the cooling medium to the porous pipe and for removing the cooling medium therefrom outside of the mandrel; and
heating means disposed between inner walls of the mandrel and the cooling means.

23. A vacuum evaporation apparatus according to claim 22, further comprising wetting means for keeping inner walls of the mandrel continuously wet with a heating medium contained in the mandrel and heated by the heating means.

24. A vacuum evaporation apparatus according to claim 1, further comprising control means for controlling said heating means so as to maintain a constant temperature on a surface of said substrate support during deposition of the evaporant on the substrate.

* * * * *